United States Patent
Toyoshima et al.

(10) Patent No.: US 6,815,657 B2
(45) Date of Patent: Nov. 9, 2004

(54) READING APPARATUS

(75) Inventors: Tsuyoshi Toyoshima, Hino (JP);
Shigeru Morikawa, Tokyo (JP);
Yasushi Mizutani, Hamura (JP)

(73) Assignee: Casio Computer Co., Ltd., Tokyo (JP)

( * ) Notice: Subject to any disclaimer, the term of this patent is extended or adjusted under 35 U.S.C. 154(b) by 175 days.

(21) Appl. No.: 10/167,097

(22) Filed: Jun. 10, 2002

(65) Prior Publication Data

US 2002/0196036 A1 Dec. 26, 2002

(30) Foreign Application Priority Data

Jun. 26, 2001 (JP) ........................................ 2001-193275
Jun. 29, 2001 (JP) ........................................ 2001-199134

(51) Int. Cl.⁷ ............................ H01L 31/02; H01B 5/14; G06T 7/00
(52) U.S. Cl. ...................... 250/214 R; 356/71; 382/124
(58) Field of Search ..................... 324/702; 250/214 R; 352/71, 115, 124, 126; 382/124

(56) References Cited

U.S. PATENT DOCUMENTS 5,708,497 A * 1/1998 Fujieda ........................ 356/71
5,940,526 A    8/1999 Setlak et al. ................ 382/124
6,414,297 B1   7/2002 Sasaki et al. ............ 250/214 R

FOREIGN PATENT DOCUMENTS

WO    WO 99/46724 A    9/1999
WO    WO 00/68874 A    11/2000

* cited by examiner

Primary Examiner—Anjan Deb
Assistant Examiner—Donald M Lair
(74) Attorney, Agent, or Firm—Frishauf, Holtz, Goodman & Chick, P.C.

(57) ABSTRACT

A reading apparatus has a sensor unit which is arranged on a substrate to read an object to be detected, a driver circuit unit which is arranged on the substrate to supply a drive signal for driving the sensor unit, and a static electricity protection portion, which is formed to cover at least a portion of the upper surface of the driver circuit unit, and at least a portion of which has electrical conductivity.

15 Claims, 22 Drawing Sheets

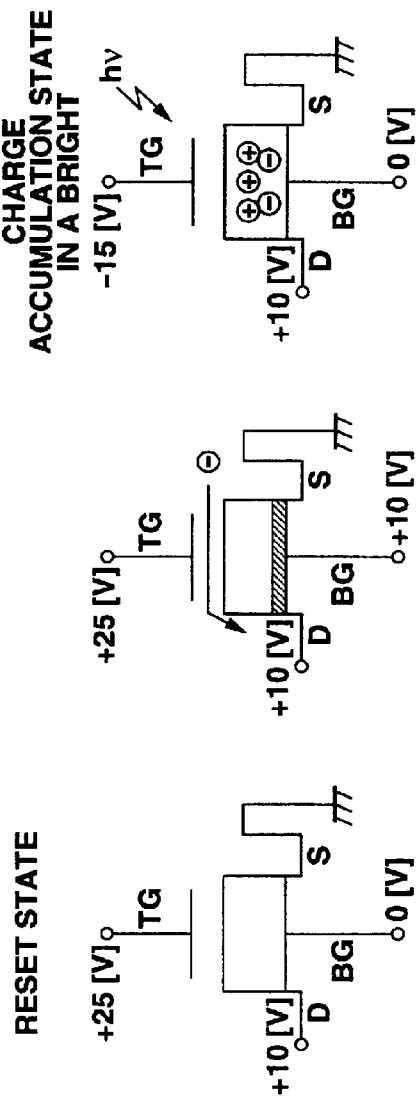
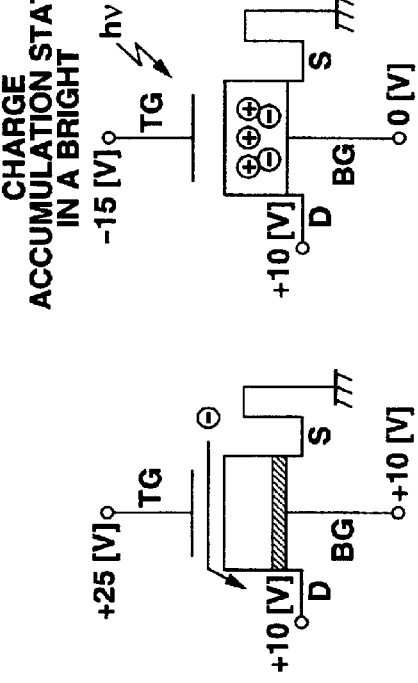
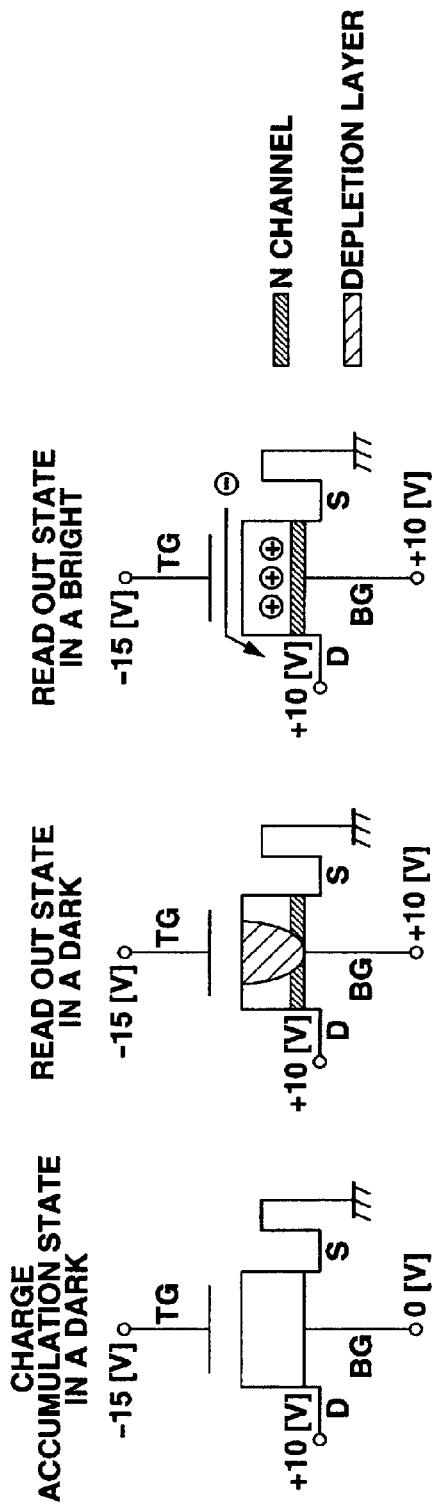

READING APPARATUS

CROSS-REFERENCE TO RELATED APPLICATIONS

This application is based upon and claims the benefit of priority from the prior Japanese Patent Applications No. 2001-193275, filed Jun. 26, 2001; and No. 2001-199134, filed Jun. 29, 2001, the entire contents of both of which are incorporated herein by reference.

BACKGROUND OF THE INVENTION

1. Field of the Invention

The present invention relates to an apparatus for reading an object to be detected and, more particularly, to a reading apparatus which is used in a living body authentication system and is used to read an object to be detected such as a fingerprint that specifies an individual.

2. Description of the Related Art

As a reading apparatus for reading a fingerprint pattern based on the fine three-dimensional pattern of a fingertip of a person to be examined, a fingerprint reader is known. The fingerprint reader comprises a sensor device which has a sensor unit for reading the fingerprint of the fingertip, and a driver circuit unit which is arranged near the sensor unit and supplies a drive signal for driving the sensor unit to the sensor unit.

Such fingerprint readers include a reader which can read fingerprints when a person touches the sensor unit with a fingertip and optically recognizing the three-dimensional pattern of skin that forms the fingerprint, and a reader which reads a change in capacitance or resistance in correspondence with the three-dimensional pattern of a finger.

Note that a human finger is often charged with electricity, and when such person touches an object with a finger, the charged static electricity as high as several thousand volts is often discharged instantly.

In some cases, the driver circuit unit of the fingerprint reader is electrically connected to and neighbors the aforementioned sensor unit on a single circuit board to attain high-density packaging. When a finger touches such fingerprint reader, the distance between the finger and the sensor unit or driver circuit unit becomes short, and a voltage of static electricity is applied to the sensor unit or driver circuit unit via an insulating film that covers the sensor unit and driver circuit unit, thus causing operation errors and/or damage.

The driver circuit unit is made up of many transistors. Amorphous silicon or polysilicon can be used as a semiconductor layer of such a transistor. Amorphous silicon or polysilicon is excited by visible light in its nature. On the other hand, since an uppermost insulating film of the driver circuit unit is normally formed of a light transmission material, when the driver circuit unit is exposed to intense external light, electron-hole pairs are generated in the semiconductor layer of the transistor, and these carriers may cause operation errors of the driver circuit unit.

BRIEF SUMMARY OF THE INVENTION

It is an object of the present invention to provide a reading apparatus which can protect a sensor unit and driver circuit unit from external factors such as static electricity, external light, and the like, which may cause damage and operation errors.

The present invention is directed to a reading apparatus (image reader 1) comprising a sensor module 3 which has a photosensor array 10 for optically reading an object to be detected, and a driver circuit unit (top gate driver 11, bottom gate driver 12, detection driver 13) for supplying a drive signal that drives the photosensor array, wherein a conductive film (static electricity protection portion 2) for discharging static electricity is formed on at least a portion of the surface of the driver circuit unit, as shown in FIG. 1.

According to the present invention, even when a fingertip charged with static electricity touches the vicinity of the driver circuit unit, since the static electricity protection portion shields the driver circuit unit, operation errors of and damage to the driver circuit unit can be prevented.

On the other hand, if an opaque conductive film is formed on the surface of the driver circuit unit, even when the driver circuit unit is exposed to external light, which comes from above the conductive film and contains ultraviolet rays and light in a given wavelength range that excites transistors of the driver circuit unit, the conductive film absorbs and/or reflects the external light, so that the external light can never enter the driver circuit unit. Therefore, operation errors of the transistors of the driver circuit unit due to incoming excitation light and their deterioration due to ultraviolet rays can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 8A to 8F are views for explaining the drive principle of the double-gate photosensor which forms the photosensor array;

DETAILED DESCRIPTION OF THE INVENTION

Figure 1:
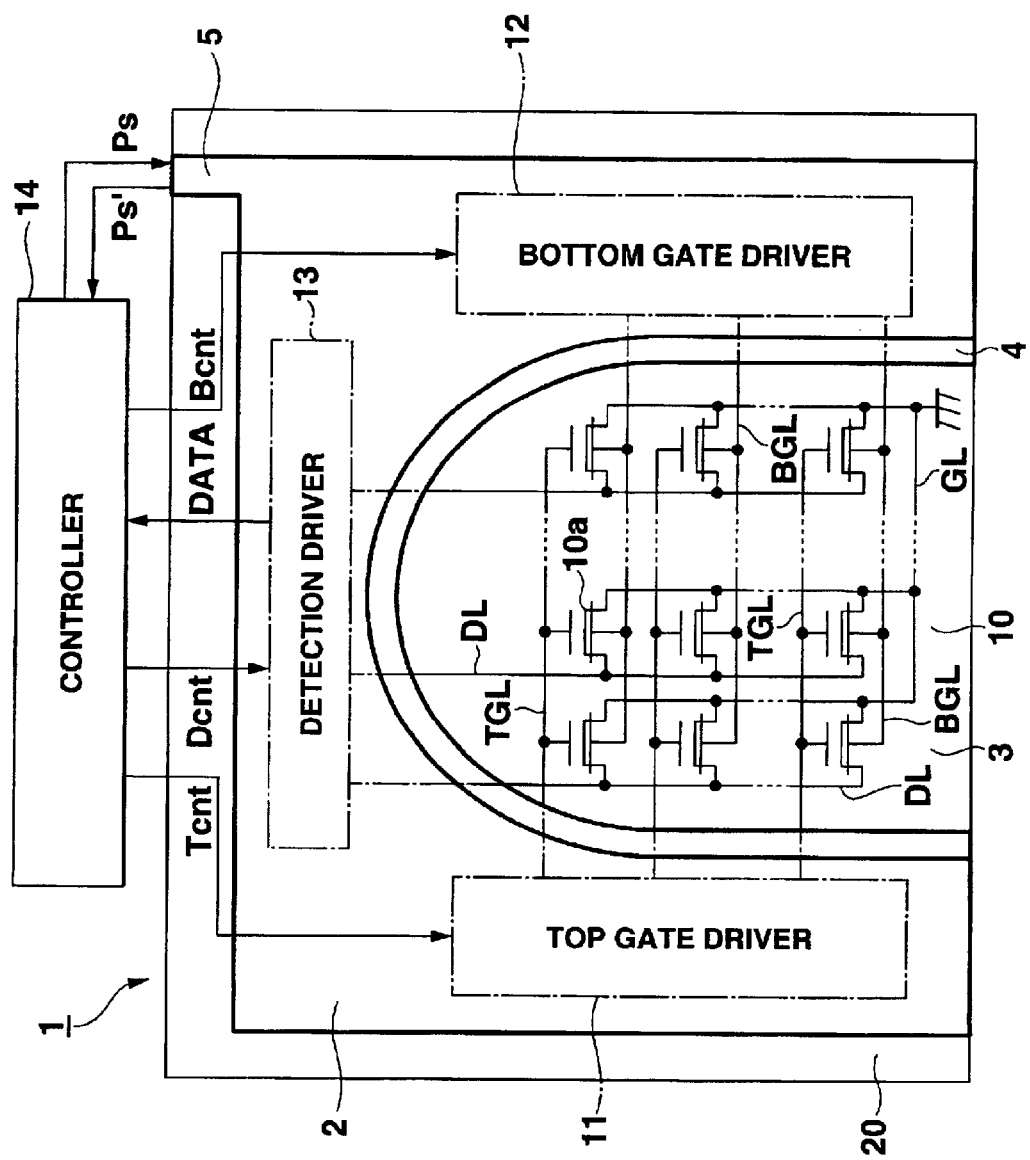
FIG. 1 is a circuit diagram of a photosensor device of a fingerprint reader according to an embodiment of the present invention.
Figure 2:
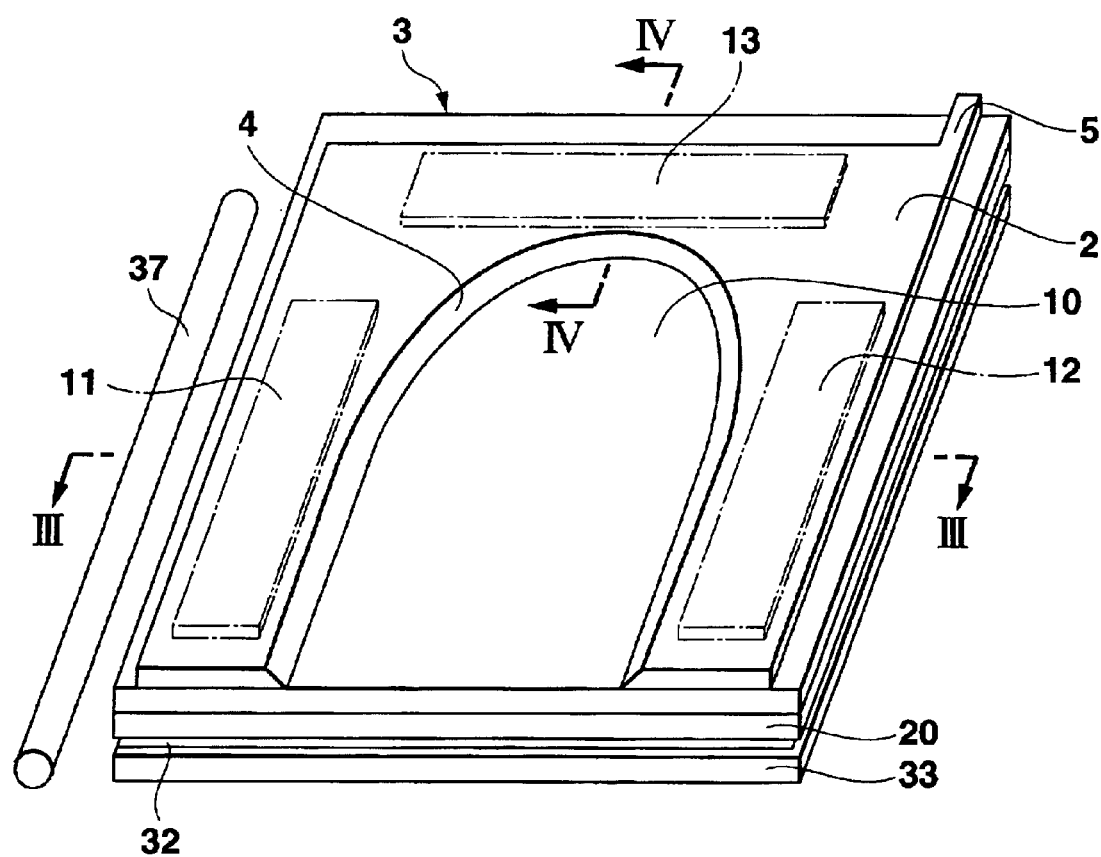
FIG. 2 is a perspective view of a sensor module.
Figure 3:
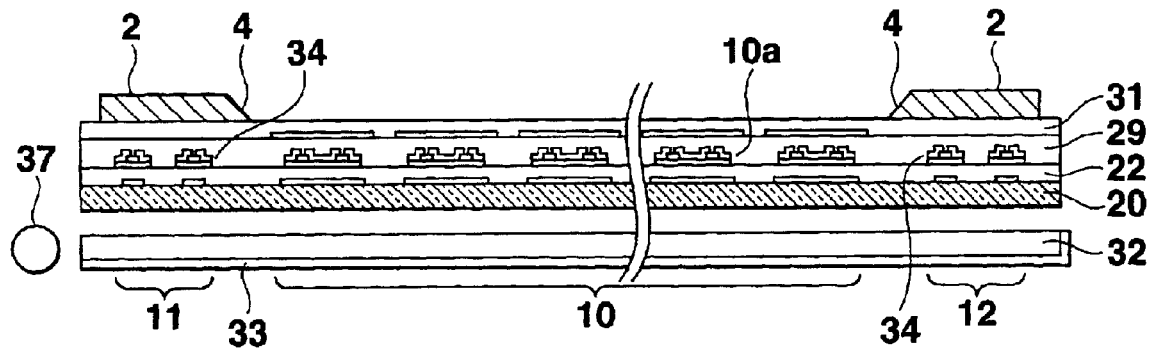
FIG. 3 is a partial sectional view taken along a line III—III in FIG. 2.
Figure 4:
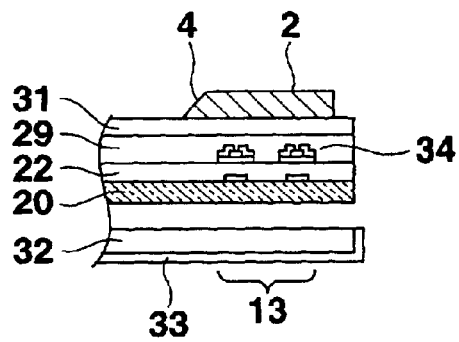
FIG. 4 is a sectional view taken along a line IV—IV in FIG. 2.

Preferred embodiments of the present invention will be described hereinafter with reference to the accompanying drawings. As shown in FIG. 1, an image reader 1 optically reads convex portions, and concave portions located between neighboring convex portions on a fingertip to define a fingerprint. This reader comprises a static electricity protection portion 2 which holds the fingertip at a predetermined position and reduces static electricity from the finger, and a sensor module 3 which reads the fingerprint at the fingertip under the control of an external controller 14. FIG. 2 is a perspective view of the sensor module shown in FIG. 1, FIG. 3 is a sectional view showing a portion taken along a line III—III in FIG. 2, and FIG. 4 is a sectional view showing a portion taken along a line IV—IV in FIG. 2.

The static electricity protection portion 2 has a member made of such as chromium, a chromium alloy, aluminum, or an aluminum alloy, which is opaque to excitation light that excites sensors in the sensor module 3 and semiconductor layers of drivers 11 to 13 to be described later, and has electrical conductivity, in at least a portion, and is attached to be placed on the surface of the sensor module 3.

The static electricity protection portion 2 is arranged around a portion of the sensor module 3, which is touched with the ball of the fingertip, and comprises a nearly elliptic object support portion 4 which has an opening as large as the ball of the fingertip to guide the finger to a predetermined position and hold it there.

The static electricity protection portion 2 receives a weak pulse signal Ps from the controller 14 via an output terminal 5 contiguous with the static electricity protection portion 2. The baseline of the pulse signal Ps is the ground potential, and the static electricity protection portion is set at the ground potential during a period 50% or more of the input period of the pulse signal Ps. The output terminal 5 is made up of a conductive member having a predetermined capacitance and resistance, and the input pulse signal Ps is input to the controller 14 as a pulse signal Ps' which is slightly attenuated and delayed in correspondence with the capacitance and resistance of the output terminal 5. When a fingertip of a person to be examined, who is charged with static electricity considerably higher than the potential of the pulse signal Ps touches or comes close to the static electricity protection portion 2, the static electricity is quickly discharged via the output terminal 5.

If no static electricity protection portion 2 is formed above a top gate driver 11, bottom gate driver 12, and detection driver 13, and a fingertip charged with static electricity touches a photosensor array 10, a high voltage is applied to the top gate driver 11, bottom gate driver 12, and detection driver 13 via a thin protection insulating layer 31 (FIG. 3), thus damaging the top gate driver 11, bottom gate driver 12, and detection driver 13 or causing their operation errors. However, in this embodiment, since the static electricity protection portion 2 is formed above the top gate driver 11, bottom gate driver 12, and detection driver 13, static electricity can be suppressed from being applied to these drivers, thus preventing operation errors and damages of the top gate driver 11, bottom gate driver 12, and detection driver 13. In addition, characteristic deterioration of and damage to DG-TFTs (Double Gate Thin Film Transistor) 10a due to static electricity can be suppressed.

When a finger touches the static electricity protection portion, the pulse signal Ps' is delayed or attenuated more in correspondence with the capacitance and resistance unique to a human body compared to that obtained when it is not touched with the finger. When the controller 14 determines that the pulse signal Ps' falls within a delay time range or attenuation range caused when an object within an allowable capacitance range and allowable unique to a delay time and degree of attenuation of a human body touches the static electricity protection portion 2, the read operation of an object to be detected by the sensor module 3 starts.

As shown in FIG. 1, the sensor module 3 has a photosensor array 10 which is arranged in the opening of the object support portion 4 on a transparent insulating substrate 20 and is used to optically read an object to be detected, a driver circuit unit including the top gate driver 11, bottom gate driver 12, and detection driver 13 which are arranged below the static electricity protection portion 2 and supply drive signals for driving the photosensor array 10, a backlight 37, and a light guide plate 32, later two elements being shown in FIG. 2.

As shown in FIG. 1, the photosensor array 10 comprises a plurality of double-gate transistors 10a (to be referred to as double-gate photosensors 10a hereinafter) which are arranged in a matrix in the opening of the object support portion 4 of the static electricity protection portion 2.

Figure 5:
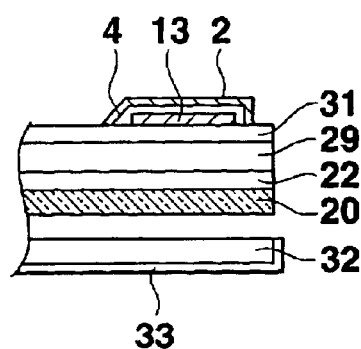
FIG. 5 is a sectional view showing an example of another structure of a detection driver and static electricity protection portion.

Since the opaque static electricity protection portion 2 is arranged above the top gate driver 11, bottom gate driver 12, and detection driver 13, as shown in FIGS. 3 and 4, external light, which comes from above the static electricity protection portion 2 and contains ultraviolet rays and light in a given wavelength range that excites transistors of the drivers can be suppressed from directly entering the drivers 11 to 13. Hence, operation errors of transistors of the drivers 11 to 13 due to excitation light and deterioration due to ultraviolet rays can be prevented. The detection driver 13 can be formed on the same surface as the double-gate photosensors 10a. Alternatively, as shown in a structure of FIG. 5, the detection driver 13 may be formed on a surface where an object to be detected is placed, and the static electricity protection portion 2 may cover the upper surface of the driver 13 to be spaced a given distance. That is, the static electricity protection portion 2 has a structure having a gap that houses the detection driver 13. When the entire static electricity protection portion 2 has conductivity, it is preferably spaced a predetermined distance from the detection driver 13 via the gap. However, when the object support portion 4 and output terminal 5 have conductivity and are connected to each other, the static electricity protection portion 2 except for the support portion 4 may be formed of an insulating member. In this case, the insulating member of the static electricity protection portion 2 may be in contact with the detection driver. By adopting such structure, an integrated circuit which is formed of monocrystalline silicon and allows high-speed operations can be adopted as the detection driver, thus quickly reading an object to be detected.

Figure 6:
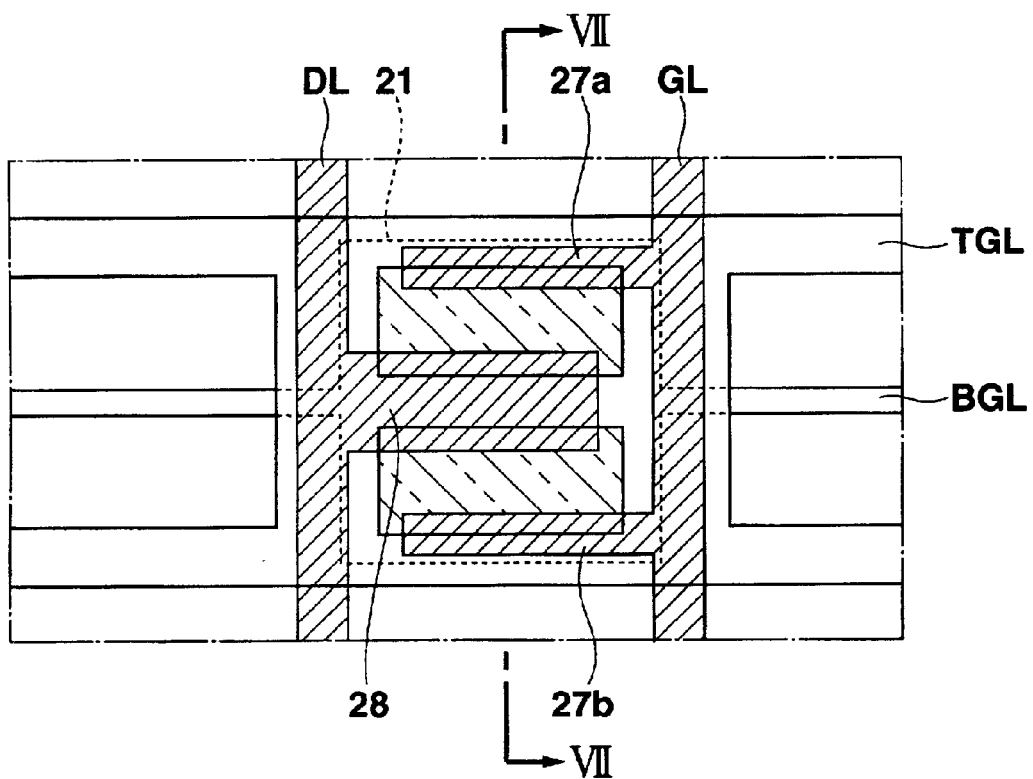
FIG. 6 is a plan view showing an example of a double-gate photosensor of the photosensor array provided to the fingerprint reader.
Figure 7:
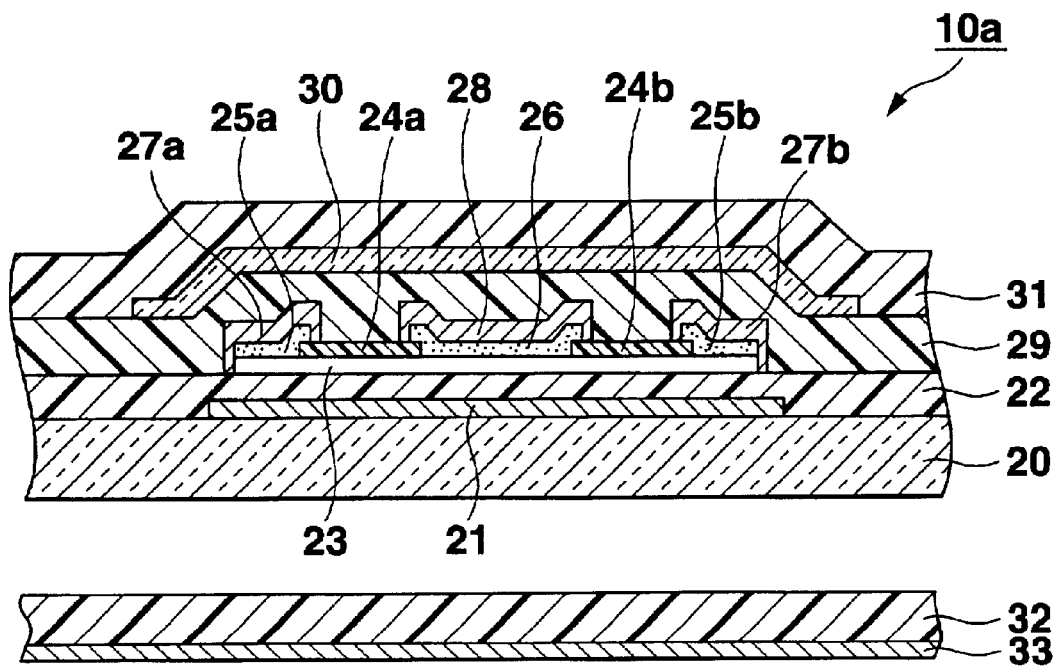
FIG. 7 is a sectional view taken along a line VII—VII in FIG. 6, and showing an example of the double-gate photosensor.

As shown in FIGS. 6 and 7, each double-gate photosensor 10a formed on an insulating substrate 20, which comprises a bottom gate electrode 21, bottom gate insulating film 22, semiconductor layer 23, block insulating films 24a and 24b, impurity-doped layers 25a, 25b, and 26, source electrodes 27a and 27b, drain electrode 28, top gate insulating film 29, top gate electrode 30, and protection insulating film 31.

The insulating substrate 20 is transparent to visible light, and is insulative. The bottom gate electrode 21 is directly formed on the insulating substrate 20. The bottom gate insulating film 22 is formed on the bottom gate electrode 21 and insulating substrate 20 to cover them. The semiconductor layer 23 is formed on the bottom gate insulating film 22 to oppose the bottom gate electrode 21. When visible light (its wavelength has 380 nm to 800 nm) enters the semiconductor layer 23, electron-hole pairs are generated in the semiconductor layer 23.

The block insulating films 24a and 24b are juxtaposed on the semiconductor layer 23 to be separated from each other. The first impurity-doped layer 25a is formed on one end portion of the semiconductor layer 23 in a channel length direction, and the second impurity-doped layer 25b is formed on the other end portion. The third impurity-doped layer 26 is formed on the center of the semiconductor layer 23 between the block insulating films 24a and 24b, and is separated from the impurity-doped layers 25a and 25b. The semiconductor layer 23 is covered by the impurity-doped layers 25a, 25b, and 26, and the block insulating films 24a and 24b. As shown in the plan view of FIG. 6, the first impurity-doped layer 25a overlaps one end portion of the block insulating film 24a, and the impurity-doped layer 25b overlaps one end portion of the block insulating film 24b. The impurity-doped layers 25a, 25b, and 26 are formed of amorphous silicon doped with n-type impurity ions.

One source electrode 27a is formed on the first impurity-doped layer 25a, the other source electrode 27b is formed on the second impurity-doped layer 25b, and the drain electrode 28 is formed on the third impurity-doped layer 26. As shown in the plan view of FIG. 6, the source electrode 27a partially overlaps the block insulating film 24a, the source electrode 27b partially overlaps the block insulating film 24b, and the drain electrode 28 partially overlaps the block insulating films 24a and 24b at its both ends. The source electrodes 27a and 27b, and the drain electrode 28 are laterally separated from each other. The top gate insulating film 29 is formed to cover the bottom gate insulating film 22, block insulating films 24a and 24b, source electrodes 27a and 27b, and drain electrode 28. On the top gate insulating film 29, the top gate electrode 30 is formed to oppose the semiconductor layer 23. The protection insulating film 31 is formed on the top gate insulating film 29 and top gate electrode 30.

The aforementioned double-gate photosensor 10a has an arrangement in which the following first and second double-gate photosensors are juxtaposed on the insulating substrate 20. The first double-gate photosensor comprises a photocarrier accumulation portion formed by the semiconductor layer 23, block insulating film 24a, source electrode 27a, drain electrode 28, top gate insulating film 29, and top gate electrode 30, and an MOS transistor formed by the semiconductor layer 23, source electrode 27a, drain electrode 28, bottom gate insulating film 22, and bottom gate electrode 21. The semiconductor layer 23 serves as the light generation region of the photocarrier accumulation portion and the channel region of the MOS transistor. The second double-gate photosensor comprises a photocarrier accumulation portion formed by the semiconductor layer 23, block insulating film 24b, source electrode 27b, drain electrode 28, top gate insulating film 29, and top gate electrode 30, and an MOS transistor formed by the semiconductor layer 23, source electrode 27b, drain electrode 28, bottom gate insulating film 22, and bottom gate electrode 21. The semiconductor layer 23 serves as the light generation region of the photocarrier accumulation portion and the channel region of the MOS transistor.

In the double-gate photosensor 10a, as shown in FIGS. 1 and 6, the top gate electrode 30, bottom gate electrode 21, drain electrode 28, and source electrodes 27a and 27b are respectively connected to a top gate line TGL, bottom gate line BGL, data line DL, and ground line GL which is connected to the ground.

In FIG. 7, the block insulating films 24a and 24b, top gate insulating film 29, and protection insulating film 31 formed on the top gate electrode 30 are formed of translucent insulating films made of silicon nitride or the like. The top gate electrode 30 and top gate line TGL are formed of a translucent conductive material such as ITO (Indium-Tin-Oxide), and exhibit high transmittance with respect to visible light. The source electrodes 27a and 27b, drain electrode 28, bottom gate electrode 21, and bottom gate line BGL are formed of a material which is selected from chromium, a chromium alloy, aluminum, an aluminum alloy, and the like, and shields visible light.

The protection insulating film 31 is exposed from the object support portion 4 of the static electricity protection portion 2 shown in FIG. 1, and serves as a portion touched with the convex portions of the fingertip.

As shown in FIGS. 2 and 3, the light guide plate 32 is flat and arranged below the insulating substrate 20, and the backlight 37 is arranged around the light guide plate 32. The light guide plate 37 is covered by a reflecting member 33 except for the upper surface and the side surface where the backlight 37 is arranged. The backlight 37 irradiates the light guide plate 32 with light in a wavelength range that can excite the double-gate photosensor 10a in accordance with the controller 14.

In the aforementioned photosensor array 10, the double-gate photosensors 10a are arranged in a matrix in the object support portion 4 of the static electricity protection portion 2 and around it.

When a fingertip charged with electricity touches the static electricity protection portion 2 and stays there upon fingerprint verification, the charged static electricity is discharged via the fingertip. At the same time, the controller 14 detects a change in voltage or current due to the capacitance of the finger, turns on the backlight 37 to start a photosense process, i.e., fingerprint read process, and sends control signals Tcnt, Bcnt, and Dcnt to the top gate driver 11, bottom gate driver 12, and detection driver 13, respectively. The controller 14 not only can output the control signals Tcnt, Bcnt, and Dcnt by reading an electric deviation caused by the capacitor unique to the finger, but can cease to output the control signals Tcnt, Bcnt, and Dcnt by reading an electric deviation when an object to be detected is other than a finger, which has a capacitance different from that of the finger, touches, and recognizing that the object to be detected is not a finger.

As shown in FIG. 1, the top gate driver 11 is formed by a shift register which is connected to the top gate lines TGL of the photosensor array 10, and sequentially and selectively outputs drive signals to the respective top gate lines TGL. The top gate driver 11 applies a reset voltage (+25 V) or carrier accumulation voltage (−15 V) to the plurality of top gate lines TGL in accordance with a group of the control signals Tcnt output from the controller 14.

The bottom gate driver 12 is formed by a shift register which is connected to the bottom gate lines BGL of the photosensor array 10, and sequentially selectively outputs drive signals to the respective bottom gate lines BGL. The bottom gate driver 12 applies a channel forming voltage (+10 V) or channel non-forming voltage (±0 V) to the plurality of bottom gate lines BGL in accordance with a group of control signals Bcnt output from the controller 14.

The detection driver 13 is connected to the data lines DL of the photosensor array 10, and applies a precharge voltage Vpg (+10 V) to all data lines DL in accordance with a group of control signals Dcnt output from the controller 14, thus precharging charges. The detection driver 13 detects a data line DL voltage that deviates in accordance with the amount of light that has entered each double-gate photosensor 10a or a drain current which flows through a source-drain path of each double-gate photosensor 10a during a predetermined period after precharging, and outputs the detected voltage or current as a data signal DATA.

The controller 14 controls the top gate driver 11 and bottom gate driver 12 using groups of control signal Tcnt and Bcnt to output signals of predetermined levels at predetermined timings for each row. With this control, the controller 14 sets the respective rows of the photosensor array 10 in the reset state, charge accumulation state, and read out state in turn. The controller 14 controls the detection driver 13 to read out a change in potential of each data line DL using the control signal group Dcnt, and fetches such change as a data signal DATA.

The photosense process will be described in detail below. In each of the double-date photosensors 10a which form the photosensor array 10, if the voltage applied to the top gate electrode 30 is +25 V and the voltage applied to the bottom gate electrode 21 is ±0 V, holes accumulated in the top gate insulating film 29 which is formed between the top gate electrode 30 and semiconductor layer 23 and is made up of silicon nitride, and semiconductor layer 23, are discharged, and the photosensor 10a is reset (i.e., a reset state). On the other hand, in the double-gate photosensor 10a, if the voltage applied across the source electrodes 27a, 27b and the drain electrode 28 is ±0 V, the voltage applied to the top gate electrode 30 is −15 V, and the voltage applied to the bottom gate electrode 30 is ±0 V, holes of electron-hole pairs generated by light that has entered the semiconductor layer 23 are accumulated in the semiconductor layer 23 and top gate insulating film 29 (i.e., a charge accumulation state). The quantity of the holes accumulated during this predetermined period depends on the amount of light.

In the charge accumulation state, the backlight 32 is set to emit light toward each double-gate photo-sensor 10a. In this state, however, since the bottom gate electrode 21 located below the semiconductor layer 23 of each double-gate photosensor 10a intercepts light, carriers are not sufficiently generated in the semiconductor layer 23. At this time, when a fingertip is placed on the upper protection insulating film 31 of each double-gate photosensor 10a, light reflected by the protection insulating film 31 and the like does not sufficiently reach the semiconductor layer 23 located immediately below a concave portion of the fingertip along a fingerprint pattern.

In this way, when the amount of incoming light is small and thus holes are accumulated not in sufficient quantities in the semiconductor layer 23, and when the voltage applied to the top gate electrode 30 is −15 V and the voltage applied to the bottom gate electrode 21 is +10 V, a depletion layer spreads in the semiconductor layer 23 due to the electric field of the top gate electrode 30, an N-channel is pinched off, and the resistance of the semiconductor layer 23 increases. On the other hand, in the charge accumulation state, light reflected by the protection insulating film 31 and the like enters the semiconductor layer 23 of the double-gate photosensor 10a located immediately below a convex portions of the fingertip, and holes are accumulated in sufficient quantities in the semiconductor layer. In such state, when the aforementioned voltages are applied, the accumulated holes are attracted and held by the top gate electrode 30, and charges of the holes relax the electric field of the top gate electrode 30. As a result, an N-channel is formed on the bottom gate electrode 21 side of the semiconductor layer 23, and the resistance of the semiconductor layer 23 decreases. The difference between the resistances of the semiconductor layer 23 in a read out state appears as a change in potential of the data line DL.

The drive principle of each of the double-gate photosensor 10a which form the photosensor array 10 will be described in association with the aforementioned photosense process with reference to schematic views in FIGS. 8A to 8F.

Since channel forming regions of the semiconductor layer 23 of each double-gate photosensor 10a are generated below the block insulating films 24a and 24b between the first and third impurity-doped layers 25a and 26, and between the second and third impurity-doped layers 25b and 26, the channel lengths are equal to the lengths of the block insulating films 24a and 24b in the channel length direction. Therefore, as shown in FIG. 8A, when the voltage applied to the bottom gate electrode 21 (BG) is ±0 V, even when the voltage applied to the top gate electrode 30 (TG) is +25 V, the portions of the semiconductor layer 23 immediately below the source and drain electrodes 27a, 27b, and 28 are influenced by the voltage applied to the source and each of the drain electrodes 27a, 27b, and 28 more strongly than that applied to the top gate electrode 30 (TG), and an N-channel which is contiguous in the channel length direction is not formed in the semiconductor layer 23. For this reason, even when a voltage of +10 V is applied to the drain electrode 28 (D), no current flows across the drain electrode 28 (D) and source electrodes 27a, 27b (S). In this state, holes accumulated in the semiconductor layer 23 and the block insulating films 24a, 24b immediately on the channel regions of the semiconductor layer 23 repel due to the presence of the voltage with the same polarity of the top gate electrode 30 (TG), and are discharged, as will be described later. This state will be referred to as a reset state hereinafter.

In a dark environment in which nearly no light is incident in the semiconductor layer 23, even when the voltage applied to the top gate electrode 30 (TG) is set at −15 V and a voltage applied to the bottom gate electrode 21 (BG) is set at ±0 V to set a charge accumulation state, as shown in FIG. 8B, no electron-hole pairs are generated, and no N-channel is formed in the semiconductor layer 23. For this reason, even when a potential difference is generated across the drain electrode 28 (D) and each of the source electrodes 27a, 27b (S), no current flows across them.

In this way, since the drain electrode 28 (D) and the source electrodes 27a, 27b (S) are formed between the two ends of the channel regions of the semiconductor layer 23 and the top gate electrode 30 (TG), the two ends of the channel regions are influenced by electric fields of the drain electrode 28 (D) and the source electrodes 27a, 27b (S), and the electric field of the top gate electrode 30 (TG) alone cannot form a contiguous channel. Therefore, when a voltage applied to the bottom gate electrode 21 (BG) is ±0 V, no channel is ever formed in the semiconductor layer 23 irrespective of the voltage applied to the top gate electrode 30 (TG).

As shown in FIG. 8C, when the voltage applied to the top gate electrode 30 (TG) is +25 V and the voltage applied to the bottom gate electrode 21 (BG) is +10 V, an N-channel is formed on the bottom gate electrode 21 (BG) side in the semiconductor layer 23. Hence, the resistance of the semiconductor layer 23 decreases, and when a voltage of +10 V is applied to the drain electrode 28, a current flows across the drain electrode 28 (D) and each of the source electrodes 27a, 27b (S).

After holes are accumulated not in sufficient quantities in the semiconductor layer 23 due to the dark environment shown in FIG. 8B, even when the voltage applied to the top gate electrode 30 (TG) is set at −15 V and the voltage applied to the bottom gate electrode 21 (BG) is set at +10 V to set a read out state, a depletion layer spreads in the semiconductor layer 23 (FIG. 8D), the N-channel is pinched off, and the resistance of the semiconductor layer 23 increases. For this reason, even when a voltage of +10 V is applied to the drain electrode, no current flows across the drain electrode 28 (D) and each of the source electrodes 27a, 27b (S), and the potential (10 V) of the precharged drain electrode 28 or data line does not change much.

Conversely, when light enters the semiconductor layer 23 in a bright environment, electron-hole pairs are generated in correspondence with the amount of incident excitation light. Under such situation, when the voltage applied to the top gate electrode 30 (TG) is set at −15 V and a voltage applied to the bottom gate electrode 21 (BG) is set at ±0 V, as shown in FIG. 8E, immediately after the reset state, positive holes of the generated electron-hole pairs are accumulated in the semiconductor layer 23 and the block insulating films 24a and 24b immediately on the channel regions of the semiconductor layer 23. The holes accumulated in the semiconductor layer 23 according to the electric field of the top gate electrode 30 (TG) are kept attracted by the electric field of the top gate electrode 30 (TG), and remain accumulated in the semiconductor layer 23 until the next reset state.

After holes are accumulated in this way, when the voltage applied to the top gate electrode 30 (TG) is set at −15 V and the voltage applied to the bottom gate electrode 21 (BG) is set at +10 V to set a read out state, as shown in FIG. 8F, the accumulated holes are attracted and held by the top gate electrode 30 (TG) to which the negative voltage is applied, and act in a direction to relax the influence of the negative voltage applied to the top gate electrode 30 (TG) on the semiconductor layer 23. For this reason, an N-channel is formed on the bottom gate electrode 21 (BG) side in the semiconductor layer 23, and the resistance of the semiconductor layer 23 decreases. When a voltage of +10 V is applied to the drain electrode 28 in this state, current flow across the drain electrode 28 (D) and the source electrodes 27a, 27b (S). For this reason, the precharged potential (10 V) of the drain electrode 28 or data line attenuates in accordance with the quantity of accumulated holes, i.e., the amount of light incident in the semiconductor layer 23.

Note that the driver circuit unit having the top gate driver 11 and bottom gate driver 12 comprises a plurality of TFTs (Thin Film Transistors) as a basic arrangement. Each TFT comprises an N-channel MOS field effect transistors, uses silicon nitride as a gate insulating film, and amorphous silicon as a semiconductor layer. The TFT are manufactured in the same manufacturing process together with the double-gate photosensors 10a, and each TFT has nearly the same structure as that of the double-gate photosensors 10a. The detection driver 13 preferably comprises an integrated circuit having either a polysilicon TFT or monocrystalline silicon transistor to achieve a high-speed read out process.

More specifically, the aforementioned driver circuit unit comprises a group of transistors (see FIG. 3), each having a similar structure to the double-gate photosensor 10a shown in FIG. 7, except for no top gate electrode 30 is stacked. Thus, the basic structure of each transistor in the transistor group 34 is nearly the same as that of the double-gate photosensor 10a, but may be designed to have different dimensions and shape depending on its function.

The static electricity protection portion 2 is formed to cover the uppermost protection insulating film 31 of the transistor group 34 in the driver circuit unit. The protection insulating film 31 is deposited to have a thickness that can flatten the uppermost surface of the driver circuit unit, and to protect circuits from static electricity and the like. The static electricity protection portion 2 is formed of an opaque electrical-conductor, and a weak pulse signal Ps is output from the controller.

Figure 9:
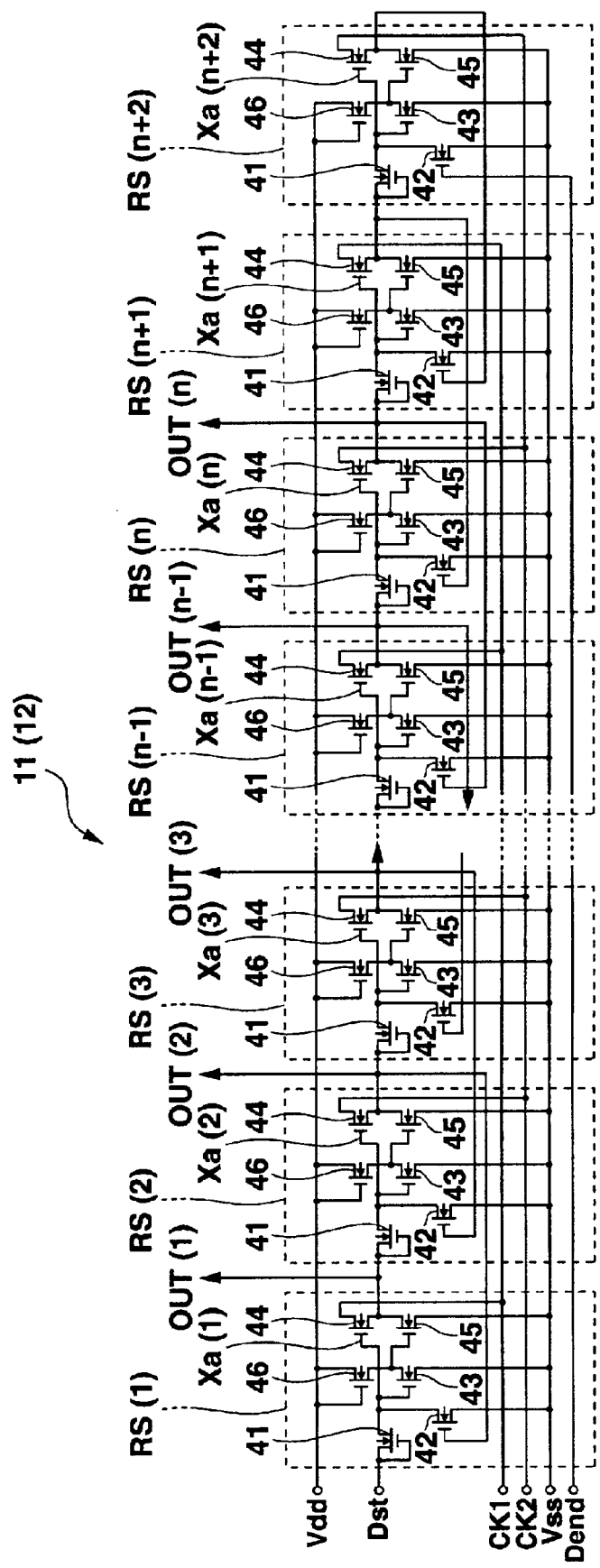
FIG. 9 is a circuit diagram of a top gate driver or bottom gate driver which forms the driver circuit unit.

Note that shift registers shown in FIG. 9 constitute the aforementioned top gate driver 11 and bottom gate driver 12. If n represents the number of rows (the numbers of top gate lines TGL and bottom gate lines BGL) of the double-gate photosensors 10a of the photosensor array 10, each of the top gate driver 11 and bottom gate driver 12 comprises n stages RS(1) to RS(n) for outputting gate signals, and dummy stages RS(n+1) and RS(n+2) used to control the stage RS(n) and the like, as shown in FIG. 9. Note that FIG. 9 shows the arrangement of the shift register when n is an even number equal to or larger than 2. Also, the stage RS(1) indicates the first stage, the stage RS(2) indicates the second stage, . . . , the stage RS(n) indicates the n-th stage, the stage RS(n+1) indicates the (n+1)-th stage, and the stage RS(n+2) indicates the (n+2)-th stage.

The first stage RS(1) receives a start signal Dst from the controller 14. If the shift register shown in FIG. 9 is the top gate driver 11, high level of the start signal Dst is +25 V, and its low level is −15 V. On the other hand, if the shift register shown in FIG. 9 is the bottom gate driver 12, high level of the start signal Dst is +10 V, and its low level is −15 V.

The second and subsequent stages RS(2) to RS(n) respectively receive output signals OUT(1) to OUT(n−1) from the previous stages RS(1) to RS(n−1) as input signals. If the shift register shown in FIG. 9 is the top gate driver 11, the output signals OUT(1) to OUT(n) of the respective stages are output onto the top gate lines TGL of the corresponding first to n-th rows. On the other hand, if the shift register shown in FIG. 9 is the bottom gate driver 12, the output signals OUT(1) to OUT(n) of the respective stages are output onto the bottom gate lines BGL of the corresponding first to n-th rows.

Furthermore, the stages RS(1) to RS(n+1) other than the stage RS(n+2) respectively receive the output signals OUT(2) to OUT(n+2) from the next stages RS(2) to RS(n+2) as reset signals. The stage RS(n+2) receives an end signal Dend from the controller 14. If the shift register shown in FIG. 9 is the top gate driver 11, high level of the end signal Dend is +25 V, and its low level is −15 V. On the other hand, if the shift register shown in FIG. 9 is the bottom gate driver 12, high level of the end signal Dend is +10 V, and its low level is −15 V.

The respective stages RS(k) (k is an arbitrary integer ranging from 1 to n+2) are applied with a reference voltage Vss from the controller 14. If the shift register shown in FIG. 9 is the top gate driver 11, the level of the reference voltage Vss is −15 V. On the other hand, if the shift register shown in FIG. 9 is the bottom gate driver 12, the level of the reference voltage Vss is ±0 V.

On the other hand, the respective stages are applied with a high-level constant voltage Vdd from the controller 14. If the shift register shown in FIG. 9 is the top gate driver 11, the level of the constant voltage Vdd is +25 V. On the other hand, if the shift register shown in FIG. 9 is the bottom gate driver 12, the level of the constant voltage Vdd is +10 V.

The odd-numbered stages RS(k) receive a clock signal CK1 from the controller 14. Also, the even-numbered stages RS(k) receive a clock signal CK2. The clock signals CK1 and CK2 alternately change to high level for each time slot during a predetermined period of the time slot in which the output signals from the shift register are shifted. That is, if the clock signal CK1 changes to high level during a predetermined period of one time slot, the clock signal CK2 changes to low level during that time slot. Then, the clock signal CK1 changes to low level during the next time slot, and the clock signal CK2 changes to high level during a predetermined period of that time slot.

If the shift register shown in FIG. 9 is the top gate driver 11, high level of the clock signals CK1 and CK2 is +25 V, and their low level is −15 V. On the other hand, if the shift register shown in FIG. 9 is the bottom gate driver 12, high level is +10 V, and low level is ±0 V.

As shown in FIG. 9, each stage RS(k) of the aforementioned shift registers, which form the top gate driver 11 and bottom gate driver 12, comprises six TFTs 41 to 46 as the transistor group 34 as a basic arrangement. Note that the TFTs 41 to 46 are n-channel MOS field effect transistors, and use silicon nitride as a material of a gate insulating film and amorphous silicon as a material of a semiconductor layer.

Figure 10:
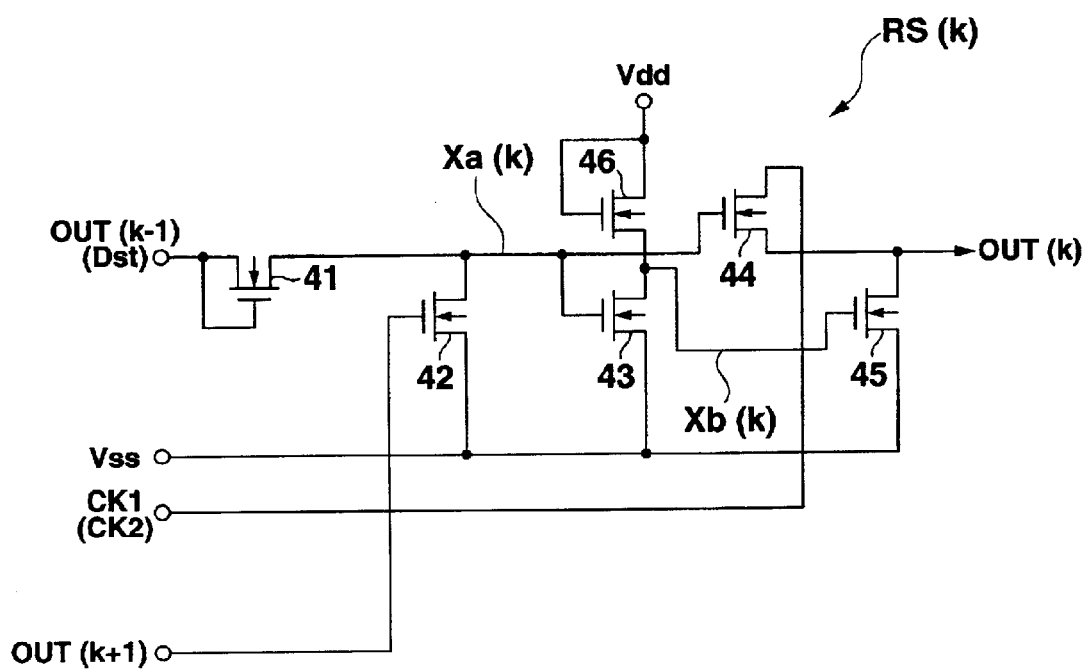
FIG. 10 is a circuit diagram of each stage of the top gate driver or bottom gate driver.

As shown in FIGS. 9 and 10, the gate and drain electrodes of the first stage RS(1) receive the start signal Dst. The gate and drain electrodes of the TFT 41 of each stage RS(k) other than the first stage RS(1) are connected to the source electrode of the TFT 45 of the previous stage RS(k−1), and the source electrode of the TFT 41 is connected to the gate electrode of the TFT 44, the drain electrode of the TFT 42, and the gate electrode of the TFT 43. The potential of a node Xa(k) as a point of a predetermined position on a wiring, which is connected to the source electrode of the TFT 41, the gate electrode of the TFT 44, the drain electrode of the TFT 42, and the gate electrode of the TFT 43 of each stage RS(k), deviates in accordance with the parasitic capacitances of the TFTs 41 to 44 associated with this wiring itself, and charges input to the capacitance of this wiring itself.

The drain electrode of the TFT 43 is connected to the source electrode of the TFT 46 and the gate electrode of the TFT 45, and the source electrodes of the TFTs 42 and 43 are applied with the reference voltage Vss. The gate and drain electrodes of the TFT 46 are applied with the constant voltage Vdd.

The drain electrode of the TFT 44 in each odd-numbered stage receives the clock signal CK1, and that of the TFT 44 in each even-numbered stage receives the clock signal CK2. The source electrode of the TFT 44 of each stage is connected to the drain electrode of the TFT 45, and the source electrode of the TFT 45 is applied with the reference voltage Vss. The gate electrode of the TFT 42 receives an output signal OUT(k+1) from the next stage.

The functions of the TFTs 41 to 46 equipped in each stage RS(k) will be explained below.

The gate and drain electrodes of the TFT 41 receive an output signal OUT(k−1) from the previous stage RS(k−1) (in this case, k=2 to n+2), or receive the start signal Dst from the controller 14 (in this case k=1). When the output signal OUT(k−1) or start signal Dst changes to high level, the TFT 41 is turned on, a current flows from the drain electrode to the source electrode, and the TFT 41 outputs the high-level output signal OUT(k−1) or start signal Dst to the source electrode.

If the TFT 42 is OFF, the potential of the node Xa(k) shifts from low to high level by the high-level output signal OUT(k−1) or start signal Dst output from the source electrode of the TFT 41. On the other hand, when the output signal OUT(k−1) or start signal Dst changes to low level, the TFT 41 is turned off, and no current flows through the drain-source path of the TFT 41.

The gate and drain electrodes of the TFT 46 are applied with the high-level constant voltage Vdd. In this manner, the TFT is diode-connected, and when the source potential is lower than the drain potential, a current flows through the drain-source path of the TFT 46, and the TFT 46 outputs a signal nearly at constant voltage Vdd level to the source electrode. The TFT 46 has a function as a load for voltage-dividing the constant voltage Vdd.

The TFT 43 is turned off when the potential of the node Xa(k) is low, and the potential of a node Xb(k) shifts from low to high level by the signal of constant voltage Vdd level output from the TFT 46. On the other hand, the TFT 43 is turned on when the potential of the node Xa(k) is high, and since a current flows through the drain-source path of the TFT 43 in this case, the TFT 43 changes the potential of the node Xb(k) to low level.

The TFT 45 is turned off when the potential of the node Xb(k) is low, and is turned on when the potential of the node Xb(k) is high. The TFT 44 is turned on when the potential of the node Xa(k) is high, and is turned off when the potential of the node Xa(k) is low. Therefore, the TFT 44 is ON while the TFT 45 is OFF, and vice versa.

The source electrode of the TFT 45 is applied with the reference voltage Vss. The ON TFT 45 outputs a signal of reference voltage Vss level (low level) from the drain electrode as an output signal OUT(k) of that stage RS(k). The OFF TFT 45 outputs the level of a signal output from the source electrode of the TFT 44 as an output signal OUT(k) of that stage RS(k).

The drain electrode of the TFT 44 receives the clock signal CK1 or CK2. When the TFT 44 is OFF, it cuts off the output of the clock signal CK1 or CK2 input to the drain electrode.

When the TFT 44 is ON, it outputs the low-level clock signal CK1 or CK2 to the source electrode. In this case, when the TFT 44 is ON, since the TFT 45 is OFF, a low-level clock signal CK1 or CK2 is output as an output signal OUT(k) of that stage RS(k).

On the other hand, when the TFT 44 is ON, if a high-level clock signal CK1 or CK2 is input to the drain electrode, since a current flows, the potential on the source side rises, and a charge is accumulated on a parasitic capacitance formed of the gate and source electrodes, and a gate insulating film between them. As a result, the potential of the node Xa(k) rises due to the bootstrap effect, and when the potential of the node Xa(k) has reached a gate saturation voltage, the source-drain current of the TFT 44 is saturated. In this manner, the ON TFT 44 outputs a signal having nearly the same potential as the high-level clock signal CK1 or CK2 to the source electrode. In this case, when the TFT 44 is ON, since the TFT 45 is OFF, a high-level clock signal CK1 or CK2 is output as an output signal OUT(k) of that stage RS(k).

The gate electrode of the TFT 42 receives an output signal OUT(k+1) from the next stage RS(k+1) (in this case, k=1 to n+1). The TFT 42 is turned on when the output signal OUT(k+1) is at high level, and the potential of the node Xa(k) shifts from high level to low level as the reference potential Vss.

Note that the gate electrode of the TFT 42 in the dummy stage RS(n+2) receives the end signal Dend from the controller 14. Alternatively, the third output signal OUT(3) in the next scan may be used instead.

Figure 11:
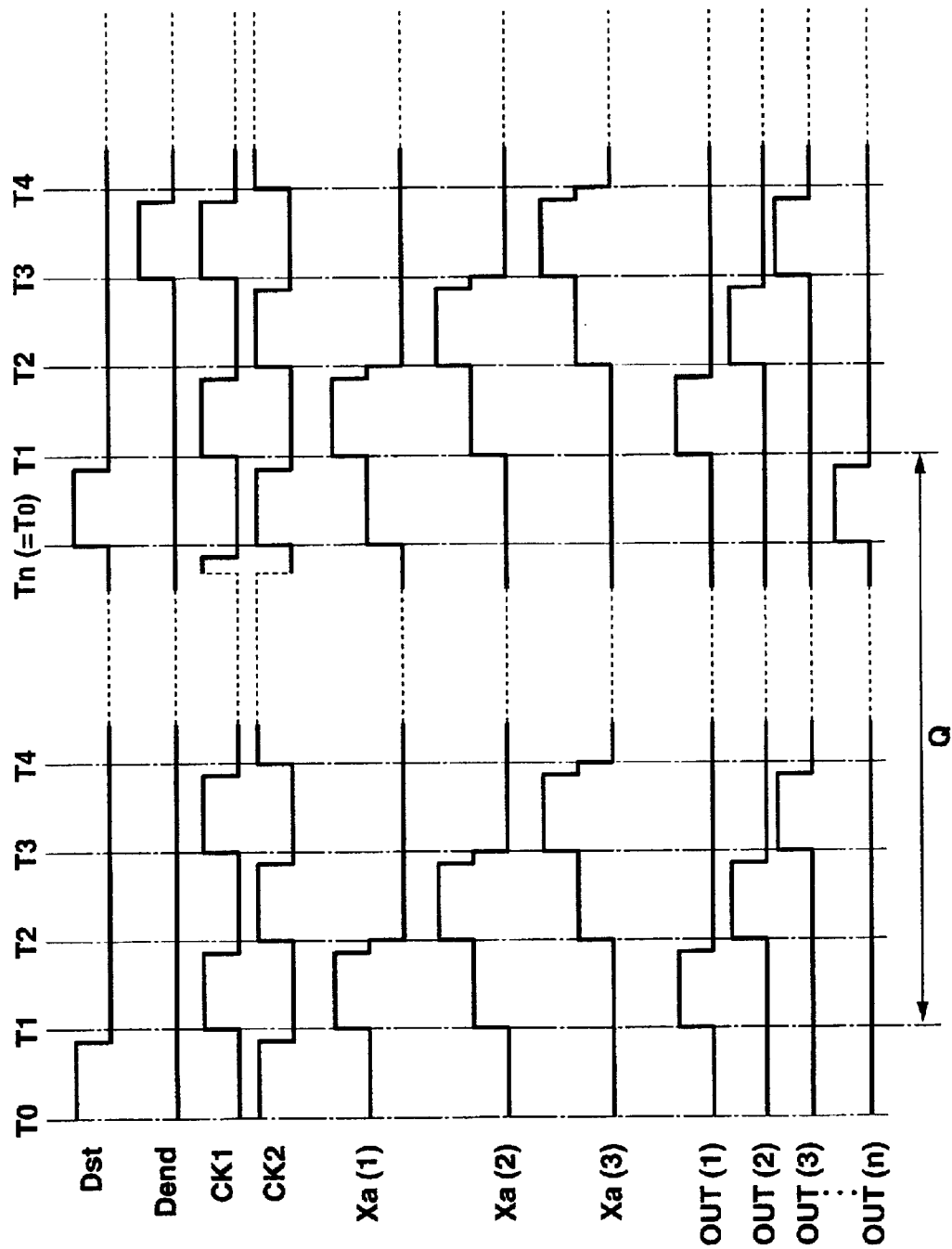
FIG. 11 is a timing chart showing the operation of the top gate driver or bottom gate driver.

The operations of the aforementioned top gate driver 11 and bottom gate driver 12 will be described below with reference to FIG. 11. In FIG. 11, a period for one T is one select period. Note that the operations of the top gate driver 11 and bottom gate driver 12 are substantially the same except for the input timings of signals and the level of the reference voltage Vss, and the output timings and levels of signals, accordingly. Hence, for the bottom gate driver 12, only differences from the top gate driver 11 will be described.

As shown in FIG. 11, a high-level (+25 V) start signal Dst is input from the controller 14 to the first stage RS(1) at timing T0. The start signal Dst remains at high level during a predetermined period until timing T1 at which one horizontal period ends.

At timing T0, the TFT 41 is turned on, and a high-level input signal (start signal Dst) input to the drain electrode of the TFT 41 is output from the source electrode. Since the TFT 42 is OFF, the potential of the node Xa(1) shifts from low to high level by the high-level input signal output from the source electrode of the TFT 41. Since the node Xa(1) changes to high level, the TFTs 43 and 44 are respectively turned on. During the period in which the high-level start signal Dst is input, the drain electrode of the ON TFT 44 receives a low-level (−15 V) clock signal CK1, which is output as an output signal OUT(1) of this stage RS(1).

When the start signal Dst changes to low level after timing T0 and before timing T1, the TFT 41 is turned off. In this case, since the TFT 42 is also OFF, the node Xa(1) maintains high level.

When the clock signal CK1 changes to high level (+25 V) at timing T1, the TFT 44 gradually outputs the potential of the clock signal CK1, and the source-side potential of the TFT 44 begins to rise. At this time, the parasitic capacitance formed of the gate and source electrodes of the TFT 44, and a gate insulating film between them is charged up. With this charge, when the potential of the node Xa(1) reaches that higher than high level due to the bootstrap effect, and the gate voltage is completely saturated, a current that flows through the drain-source path of the TFT 44 is saturated. As a result, the potential of the output signal OUT(1) output from this stage RS(1) becomes +25 V, nearly equal to the clock signal CK1, i.e., high level. During the period in which the clock signal CK1 is at high level, since the parasitic capacitance of the TFT 44 is charged up, the potential of the node Xa(1) becomes as high as around +45 V.

The clock signal CK1 changes to low level (−15 V) after timing T1 and before timing T2. As a result, the level of the output signal OUT(1) becomes nearly equal to −15 V. The potential of the node Xa(1) located on the other side of the parasitic capacitance lowers accordingly.

The high-level output signal OUT(1) output from the first stage RS(1) during a predetermined period from timings T1 to T2 is input to the gate and drain electrodes of the TFT 41 of the second stage RS(2). Then, as in the case wherein the high-level start signal Dst is input to the first stage RS(1), the potential of the node Xa(2) of the second stage RS(2) shifts from low to high level. During a given period from timings T1 to T2, the TFT 44 is turned on and the TFT 45 is turned off in the second stage RS(2). During a period in which the high-level input signal (output signal OUT(1)) is input, the drain electrode of the ON TFT 44 receives a low-level (−15 V) clock signal CK2, which is output as an output signal OUT(2) of that stage RS(2).

At timing T2, the clock signal CK2 changes to high level (+25 V). The parasitic capacitance formed of the gate and source electrodes of the TFT 44, and a gate insulating film between them is charged up as the source potential of the TFT 44 of the stage RS(2) rises. That is, the potential of the node Xa(2) shifts from low to high levels, and when the potential of the node Xa(2) has reached a gate saturation voltage due to the bootstrap effect, a current that flows across the drain and source electrodes of the TFT 44 is saturated. In this manner, the potential of the output signal OUT(2) output from the stage RS(2) becomes nearly equal to that of the clock signal CK2, i.e., +25 V (high level). During a period in which the clock signal CK2 is at high level, since the parasitic capacitance of the TFT 44 is charged up, the potential of the node Xa(2) also becomes as high as around +45 V.

The high-level output signal OUT(2) is input to the gate electrode of the TFT 42 of the first stage RS(1) after timing T2 and before timing T3. As a result, the potential of the node Xa(1) of the stage RS(1) becomes equal to the reference voltage Vss.

The clock signal CK2 changes to low level (−15 V) immediately before timing T3. As a result, the level of the output signal OUT(2) becomes nearly equal to −15 V. In stage RS(2), the charge charged on the parasitic capacitance of the TFT 44 is discharged, and the potential of the node Xa(2) lowers in correspondence with the drop of the clock CK2.

Likewise, since the odd-numbered stages operate in the same manner as the first stage RS(1) and the even-numbered stages operate in the same manner as the second stage RS(2) within one scan period Q until the next timing T1, output signals OUT(1) to OUT(n) of the respective stages sequentially change to high level. That is, a stage that outputs a high-level output signal due to the bootstrap effect sequentially shifts to the next stage. The high-level output signals OUT(1) to OUT(n) do not attenuate even when they are shifted to the next stage. One scan period Q later, the start signal Dst changes to high level again, and the aforementioned operations are repeated in the subsequent stages RS(1) to RS(n).

Even after the last stage RS(n) of the top gate line TGL or bottom gate line BGL outputs a high-level output signal OUT(n) to the next dummy stage RS(n+1), the potential of the node Xa(n) remains at high level. The TFT 42 of the last stage RS(n) is turned on by a high-level output signal OUT(n+1) from the dummy stage RS(n+1), which is output since a high-level output signal OUT(n) is output to the next stage RS(n+1), and the potential of the node Xa(n) becomes equal to the reference voltage Vss. Likewise, the TFT 42 of the dummy stage RS(n+1) is turned on by the high-level output signal OUT(n+2) from the dummy stage RS(n+2), and the potential of the node Xa(n+1) becomes equal to the reference voltage Vss. When a high-level end signal Dend is input to the TFT 42 of the dummy stage RS(n+2), the potential of the node Xa(n+2) of the dummy stage RS(n+2) changes from high level to the reference voltage Vss (low level). When such shift register is repetitively operated for a series of a plurality of scan periods Q, the potential of the node Xa(n+2) of the dummy stage RS(n+2) can change from high to low levels by setting to input the start signal Dst to the gate of the TFT 42 of the dummy stage RS(n+2) in place of the end signal Dend.

The operation of the bottom gate driver 12 is substantially the same as that of the top gate driver 11, except that the output timing of each high-level output signal OUT(k) is later than that of the top gate driver 11, and a period defined between the output timings of high-level output signals OUT(k) of the top gate driver 11 and bottom gate driver 12 corresponds to a hole accumulation period upon incidence of light. Since high level of the clock signals CK1 and CK2 input from the controller 14 to the bottom gate driver 12 is +10 V, high level of the output signal OUT(k) from each stage RS(k) (in this case, k=1 to n) is nearly equal to +10 V, and the potential level of the node Xa(k) at that time reaches a gate saturation voltage due to bootstrap. A period in which the clock signal CK1 or CK2 of the bottom gate driver 12 is at high level can be shorter or longer than that in which the clock signal CK1 or CK2 of the top gate driver 11 is at high level, as needed.

Note that the top gate driver 11 and bottom gate driver 12 to which the aforementioned shift register is applied sequentially select the top gate lines TGL and bottom gate lines BGL in turn and apply a predetermined voltage to them in accordance with the control signal groups Tcnt and Bcnt from the controller 14. These control signal groups Tcnt and Bcnt include the aforementioned clock signals CK1 and CK2, start signal Dst, end signal Dend, constant voltage Vdd, and reference voltage Vss.

The operation and effect upon reading the fingerprint of a person to be examined by the image reading apparatus 1 will be explained below.

The person to be examined touches the static electricity protection portion 2 with a fingertip so that the fingertip fits on the static electricity protection portion 2, as shown in FIG. 1. At this time, static electricity from the fingertip is discharged from the static electricity protection portion 2, and may cause damage to or operation errors of the sensor module 3.

When the fingertip touches the static electricity protection portion 2, the controller 14 detects a pulse signal Ps' which deviates in the static electricity protection portion 2 due to addition of the capacitor of the finger. When the controller 14 determines contact of the human finger, it supplies the control signal groups Tcnt, Bcnt, and Dcnt to the top gate driver 11, bottom gate driver 12, and detection driver 13 to start the photosense process, and supplies an emission signal to the backlight 37.

In response to this signal, the backlight 37 emits light, and the top gate driver 11, bottom gate driver 12, and detection driver 13 output signals to the double-gate photosensors 10a in the photosensor array 10 as needed, thus executing the photosense process for each row.

The photosense process will be described below with reference to FIG. 7. Light emitted by the backlight 37 does not directly enter the semiconductor layer 23 due to the presence of the bottom gate electrode 21, and travels toward the protection insulating film 31 in a portion where no bottom gate electrode 21 is formed.

Each convex portion of the fingertip contacts the protection insulating film 31, and light that hits the convex portion is irregularly reflected and enters the semiconductor layer 23 of the double-gate photosensor 10a located immediately below the convex portion, thus generating electron-hole pairs in the semiconductor layer 23 in correspondence with the amount of light.

On the other hand, since each concave portion of the fingertip does not contact the protection insulating film 31, it does not irregularly reflect light, and cannot make light, which is enough to generate carriers, enter the semiconductor layer 23 of the double-gate photosensor 10a immediately below the concave portion.

Each double-gate photosensor 10a accumulates holes of the generated electron-hole pairs in the semiconductor layer 23 and top gate insulating film 29 by a carrier accumulation voltage (−15 V) applied to the top gate electrode 30, and the charges of these holes relax the influence of the carrier accumulation voltage.

After an elapse of a predetermined period of time, when the potential of the bottom gate electrode 21 is switched from a channel non-forming voltage (0 V) to a channel forming voltage (+10 V), the drain current value in each double-gate photosensor 10a increases with increasing quantity of accumulated holes, i.e., amount of incoming light, and a deviation of the potential of the data line DL becomes larger.

The detection driver 13 reads the potentials of the data lines DL for respective rows, converts them into data signals DATA, and outputs these signals to the controller 14. As a result, the fingerprint pattern of the person to be examined is read.

Figure 12:
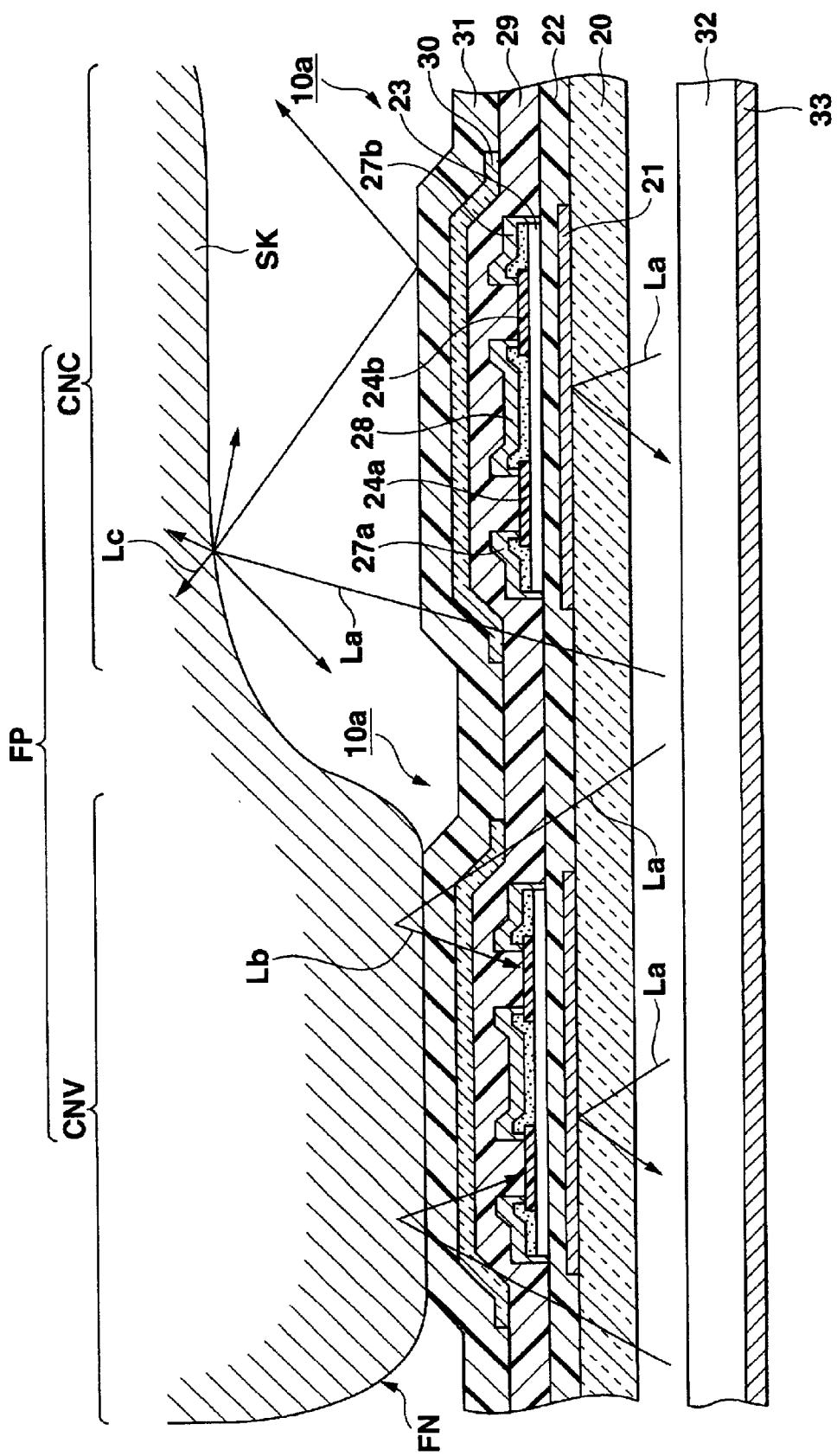
FIG. 12 is a sectional view showing the read operation of the fingerprint reader according to the embodiment of the present invention.

FIG. 12 is a sectional view showing principal part of an image reading apparatus (fingerprint reader) to which the aforementioned photosensor system is applied.

As shown in FIG. 12, in an image reading apparatus for reading an image pattern such as a fingerprint pattern or the like, when irradiation light La comes from the backlight (light source) 37 arranged below the insulating substrate 20 such as a glass substrate or the like on which the double-gate photosensors 10a are formed, the irradiation light La which has directly entered each double-gate photosensor 10a (more specifically, the bottom gate electrode 21, drain electrode 38, and source electrodes 27a and 27b) is reflected, but the irradiation light La which has entered the transparent insulating substrate 20 and the insulating films 22, 29, and 31, except for the forming regions of the double-gate photosensors 10a, is transmitted through these films, and hits a finger (object to be detected) FN placed on the protection insulating film 31.

Upon detecting a fingerprint pattern by the fingerprint reader, since a semi-transparent skin surface layer SK of the finger FN of a convex portion CNV of a fingerprint portion FP contacts the protection insulating film 31 formed as the uppermost layer of the photosensor array 10, an air layer with a low refractive index is removed from the interface between the protection insulating film 31 and skin surface layer SK. Since the thickness of the skin surface layer SK is larger than 650 nm, light La that has entered the convex portion CNV of the fingerprint portion FP travels in the skin surface layer SK while being scattered and reflected. Some light components of traveling reflected light Lb are transmitted through the transparent top gate electrode 30 and the transparent insulating films 22, 29, and 31, and enter the semiconductor layer 23 of the corresponding double-gate photosensor 10a as excitation light. In this manner, when carriers (holes) generated by light that has entered the semiconductor layer 23 of the double-gate photosensor 10a located at the position corresponding to the convex portion CNV of the finger FN are accumulated, the image pattern of the finger FN can be read as contrast information according to a series of drive control methods mentioned above.

On the other hand, light La, which is emitted toward a concave portion CNC of the fingerprint portion FP, passes through the interface between a fingerprint detection surface 30a of the protection insulating film 31 and an air layer, reaches the finger FN ahead of the air layer, and is scattered inside the skin surface layer SK. In this case, since the skin surface layer K has a higher refractive index than air, light Lc in the skin surface layer SK, which has entered the interface at a given angle, hardly leaves the skin surface layer toward the air layer, or is attenuated while being repetitively irregularly reflected by the air layer, thus suppressing entrance of light components in the semiconductor layer 23 of the double-gate photosensor 10a located at the position corresponding to the concave portion CNC.

In this manner, since the protection insulating film 31 is formed of a transparent material, light, which hits the finger FN placed on the protection insulating film 31, and is scattered and reflected by the finger, can satisfactorily enter the semiconductor layer 23 of each double-gate photosensor 10a. Hence, the image pattern (fingerprint) of the object to be detected can be satisfactorily read without impairing the read sensitivity characteristics upon reading the finger (object to be detected) FN.

The drive control method of the double-gate photosensor will be described below with reference to FIGS. 13 and 14.

Figure 13:
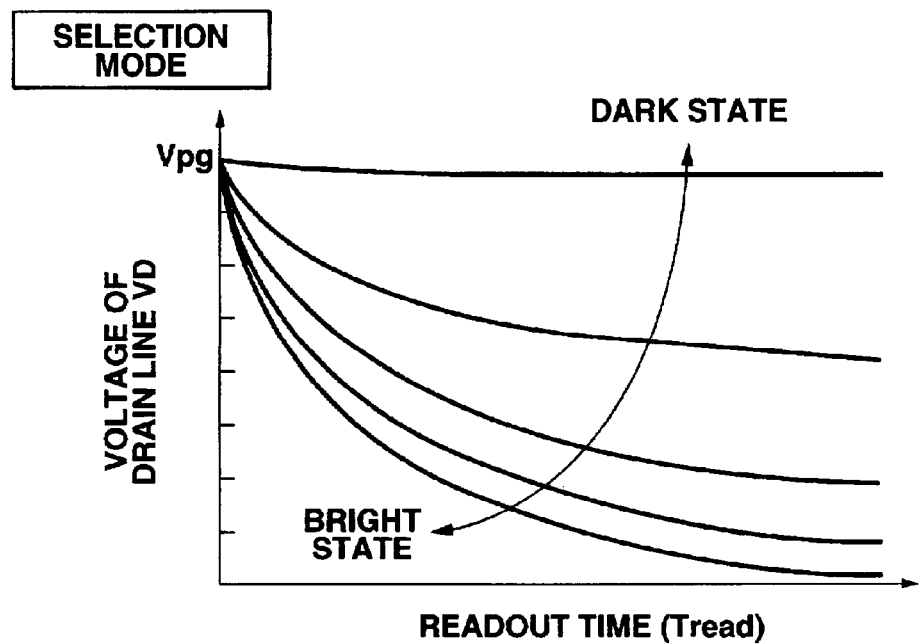
FIG. 13 is a graph showing a change in potential in a selection mode.
Figure 14:
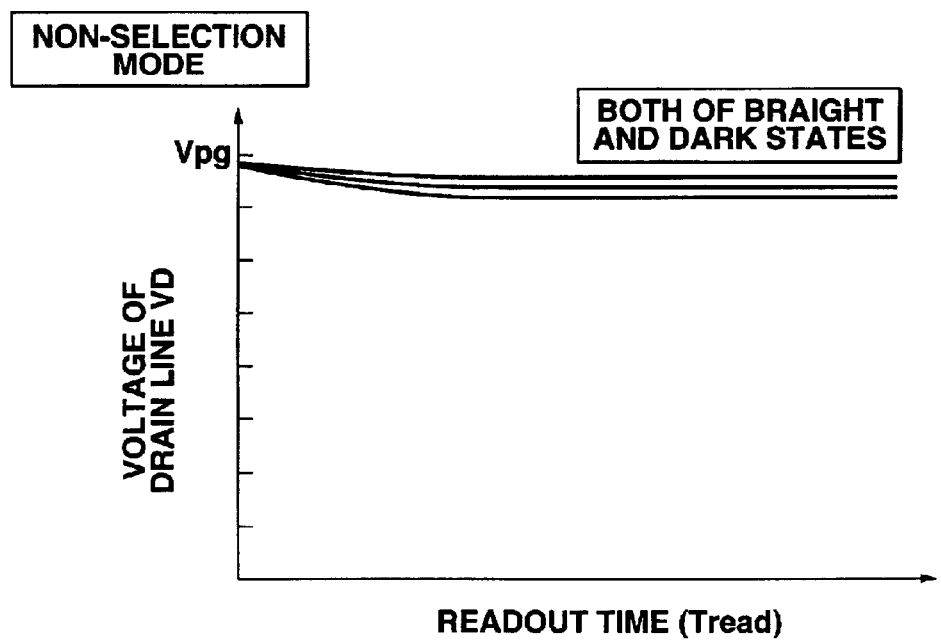
FIG. 14 is a graph showing a change in potential in a non-selection mode.

FIGS. 13 and 14 show the light response characteristics of an output voltage of the double-gate photosensor.

On the convex portion CNV of the fingerprint portion FP, since reflected light Lb has entered the semiconductor layer 23, a state shown in FIG. 8E is formed. Subsequently, when a channel forming voltage Vbg (+10 V) is applied to a bottom gate terminal BG to start a selection mode, carriers (holes) accumulated in the channel region of the semiconductor layer 23 act in a direction to relax a negative voltage Vtg (−15 V) applied to a top gate terminal TG (FIG. 8F), and an n-channel is formed by Vbg (+10 V) at the bottom gate terminal BG. A voltage (drain voltage) VD at the drain terminal D gradually lowers from a precharge voltage Vpg in accordance with a drain current with an elapse of time, as shown in a bright state in FIG. 13. On the concave portion CNC of the fingerprint portion FP, since sufficient light does not enter the semiconductor layer 23, a state shown in FIG. 8B is formed. Subsequently, when a channel forming voltage Vbg (+10 V) is applied to the bottom gate terminal BG to start a selection mode, the potential lowers little from the precharge voltage Vpg even after an elapse of time, as shown in a dark state in FIG. 13. In a non-selection mode in which a low-level voltage (e.g., Vbg=0 V) is applied to the bottom gate terminal BG, since the previous state is a bright state, the double-gate photosensor 10a is OFF and no channel is formed irrespective of electron-hole pairs generated in the semiconductor layer 23 or a dark state in which nearly no light enters the semiconductor layer 23. Therefore, as shown in FIG. 14, the drain voltage VD holds a voltage value approximate to the precharge voltage Vpg. In this manner, a selection function for switching the read state of the double-gate photosensor 10a between the selection mode and non-selection mode is implemented depending on a voltage applied to the bottom gate terminal BG.

A practical operation in the photosensor array 10 in which the plurality of double-gate photosensors 10a are arranged in a matrix in the aforementioned operation for reading a two-dimensional fingerprint pattern will be explained below with reference to schematic views of FIGS. 15A to 15I. In the following description, a 1T period has the same duration as one selection period for 1T shown in FIG. 11. For the sake of simplicity, the operation of the first three rows of the double-gate photosensors 10a of those arranged in the photosensor array 10 will be examined. The bottom gate driver 12 outputs a signal having a waveform, the timing of which is defined by shifting timing Tk of the waveform of the top gate driver 11 shown in FIG. 11 to timing Tk-3. That is, when the top gate driver 11 operates based on a signal of a waveform at timing T4 in FIG. 11, the bottom gate driver 12 operates based on a signal of a waveform at timing T1 in FIG. 11.

Figure 15:
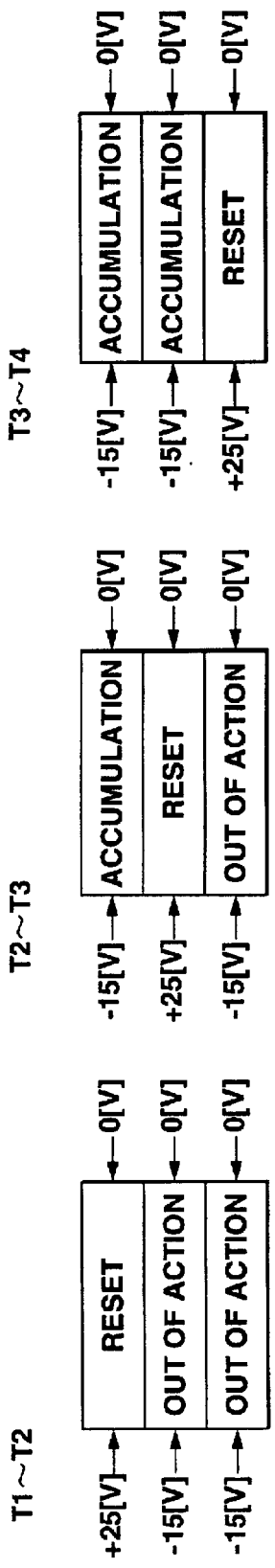
FIGS. 15A to 15I are views for explaining the operations of respective double-gate photosensors.

During a 1T period between timings T1 to T2, as shown in FIG. 15A, the top gate driver 11 applies +25 V to the first top gate line TGL, and applies −15 V to the second and third (all remaining) top gate lines TGL. That is, the stage RS(1) of the top gate driver 11 outputs a high-level output signal, and the stages RS(2) and RS(3) output low-level output signals. At this time, the bottom gate driver 12 applies 0 V to all the bottom gate lines BGL. That is, the stages RS(1) to RS(3) of the bottom gate driver 12 output low-level output signals. During this period, the double-gate photosensors 10a of the first row are set in a reset state (see FIG. 8A), and those in the second and third rows are set in a state in which they do not influence the photosense process.

During a 1T period between timings T2 and T3, as shown in FIG. 15B, the high-level output signal shifts to the stage RS(2) of the top gate driver 11, and the top gate driver 11 applies +25 V to the second top gate line TGL and −15 V to other top gate lines TGL. On the other hand, the bottom gate driver 12 applies 0 V to all the bottom gate lines BGL. During this period, the double-gate photosensors 10*a* of the first row are set in a charge accumulation state (see FIG. 8B or 8E), those of the second row are reset in a reset state (see FIG. 8A), and those of the third row are set in a state in which they do not influence the photosense process.

During a 1T period between timings T3 and T4, as shown in FIG. 15C, the high-level output signal shifts to the stage RS(3) of the top gate driver 11, and the top gate driver 11 applies +25 V to the third top gate line TGL and −15 V to other top gate lines TGL. On the other hand, the bottom gate driver 12 applies 0 V to all the bottom gate lines BGL. During this period, the double-gate photosensors 10*a* of the first and second rows are set in a charge accumulation state (see FIG. 8B or 8E), and those of the third row are reset in a reset state (see FIG. 8A).

During a 0.5T period between timings T4 and T4.5, as shown in FIG. 15D, the top gate driver 11 applies −15 V to all the three top gate lines TGL, and applies a reset voltage (+25 V) to the fourth top gate line TGL. On the other hand, the bottom gate driver 12 applies 0 V to all the bottom gate lines BGL. The detection driver 13 applies +10 V to all the data lines DL. During this period, the double-gate photosensors 10*a* of all the three rows are set in a charge accumulation state (see FIG. 8B or 8E).

During a 0.5T period between timings T4.5 and T5, as shown in FIG. 15E, the top gate driver 11 applies −15 V to all the three top gate lines TGL. On the other hand, the bottom gate driver 15 applies +10 V to the first bottom gate line BGL, and 0 V to other bottom gate lines BGL. That is, the stage RS(1) of the bottom gate driver 12 outputs a high-level signal, and the stages RS(2) and RS(3) output low-level output signals. During this period, the double-gate photosensors 10*a* of the first row are set in a read out state shown in FIG. 8D or 8F, and those of the second and third rows are maintained in the charge accumulation state (see FIG. 8B or 8E).

In the double-gate photosensors 10*a* of the first row, if the semiconductor layers 23 are irradiated with sufficient light during a period between timings T2 and T4.5 in which these photosensors are set in the charge accumulation state, since a read out state shown in FIG. 8F is set, and N-channels are formed in the semiconductor layers 23, the potential on the corresponding data lines DL is discharged. On the other hand, if each semiconductor layer 23 is not irradiated with sufficient light during a period between timings T2 and T4.5, since a read out state shown in FIG. 8D is set, and the N-channel in the semiconductor layer 23 is pinched off, the potential on the corresponding data line DL is not so discharged. The detection driver 13 reads out the potential on each data line DL during a period between timings T4.5 and T5, converts it into a data signal DATA, and supplies that signal to the controller 14 as data detected by the double-gate photosensors 10*a* of the first row.

During a 0.5T period between timings T5 and T5.5, as shown in FIG. 15F, the top gate driver 11 applies −15 V to all the three top gate lines TGL. On the other hand, the bottom gate driver 12 applies 0 V to all the bottom gate lines BGL. The detection driver 13 applies +10 V to all the data lines DL. During this period, the double-gate photosensors 10*a* of the first row have completed the read out process, and those of the second and third rows are set in a charge accumulation state (see FIG. 8B or 8E). During the period between timings T5 and T5.5, although a high-level output signal from the stage RS(1) of the bottom gate driver 12 is input to the stage RS(2), since the clock signal CK2 input to that stage RS(2) is not at high level, 0 V is applied to the second bottom gate line BGL.

During a 0.5T period between timings T5.5 and T6, as shown in FIG. 15G, the top gate driver 11 applies −15 V to all the three top gate lines TGL. On the other hand, the high-level output signal shifts to the stage RS(2) of the bottom gate driver 12, and the bottom gate driver 12 applies +10 V to the second bottom gate line BGL and 0 V to other bottom gate lines BGL. During this period, the double-gate photosensors 10*a* of the first row have completed the read out process, those of the second row are set in a read out state shown in FIG. 8D or 8F, and those of the third row are set in a charge accumulation state (see FIG. 8B or 8E).

In the double-gate photosensors 10*a* of the second row, if each semiconductor layer 23 is irradiated with sufficient light during a period between timings T3 and T5.5 in which the photosensor is set in the charge accumulation state, since a read out state shown in FIG. 8F is set, and an N-channel is formed in the semiconductor layer 23, the potential on the corresponding data line DL is discharged. On the other hand, if the semiconductor layer 23 is not irradiated with sufficient light during a period between timings T3 and T5.5, since a read out state shown in FIG. 8D is set, and the N-channel in the semiconductor layer 23 is pinched off, the potential on the corresponding data line DL is not so discharged. The detection driver 13 reads out the potential on each data line DL during a period between timings T5.5 and T6, converts it into a data signal DATA, and supplies that signal to the controller 14 as data detected by the double-gate photosensors 10*a* of the second row.

During a 0.5T period between timings T6 and T6.5, as shown in FIG. 15H, the top gate driver 11 applies −15 V to all the three top gate lines TGL. On the other hand, the bottom gate driver 12 applies 0 V to all the three bottom gate lines BGL. Also, the detection driver 13 applies +10 V to all the data lines DL. During this period, the double-gate photosensors 10*a* of the first and second rows have completed the read out process, and those of the third row are set in a charge accumulation state (see FIG. 8B or 8E).

During a 0.5T period between timings T6.5 and T7, as shown in FIG. 15I, the top gate driver 11 applies −15 V to all the three top gate lines TGL. On the other hand, the high-level output signal shifts to the stage RS(3) of the bottom gate driver 12, and the bottom gate driver 12 applies +10 V to the third bottom gate line BGL and 0 V to other bottom gate lines BGL. During this period, the double-gate photosensors 10*a* of the first and second rows have completed the read out process, and those of the third row are set in a read out state shown in FIG. 8D or 8F.

In the double-gate photosensors 10*a* of the third row, if each semiconductor layer 23 is irradiated with sufficient light during a period between timings T4 and T6.5 in which the photosensor is set in the charge accumulation state, since a read out state shown in FIG. 8F is set, and an N-channel is formed in the semiconductor layer 23, the potential on the corresponding data line DL is discharged. On the other hand, if the semiconductor layer 23 is not irradiated with sufficient light during a period between timings T4 and T6.5, since a read out state shown in FIG. 8D is set, and the N-channel in the semiconductor layer 23 is pinched off, the potential on the corresponding data line DL is not so discharged. The detection driver 13 reads out the potential on each data line DL during a period between timings T6.5 and T7, converts it into a data signal DATA, and supplies that signal to the controller 14 as data detected by the double-gate photosensors 10a of the third row.

In this manner, when the controller executes a predetermined process for the data signals DATA supplied from the detection driver 13 for respective rows, the fingerprint pattern of the fingertip of the person to be examined is read.

According to the image reading apparatus 1 of this embodiment, the driver circuit unit comprises the top gate driver 11, bottom gate driver 12, and detection driver 13, each of which drives comprises the transistor group 34, and the static electricity protection portion 2 is formed above the top gate driver 11, bottom gate driver 12, and detection driver 13. Even when the fingertip charged with electricity touches a portion above the driver circuit unit, static electricity upon contact is never discharged into the driver circuit unit, thus preventing operation errors of and damage to the driver circuit unit. Also, since the static electricity protection portion 2 is opaque to excitation light of the transistor groups 34 and ultraviolet rays, operation errors due to excitation light and deterioration due to ultraviolet rays can be suppressed.

Figure 16:
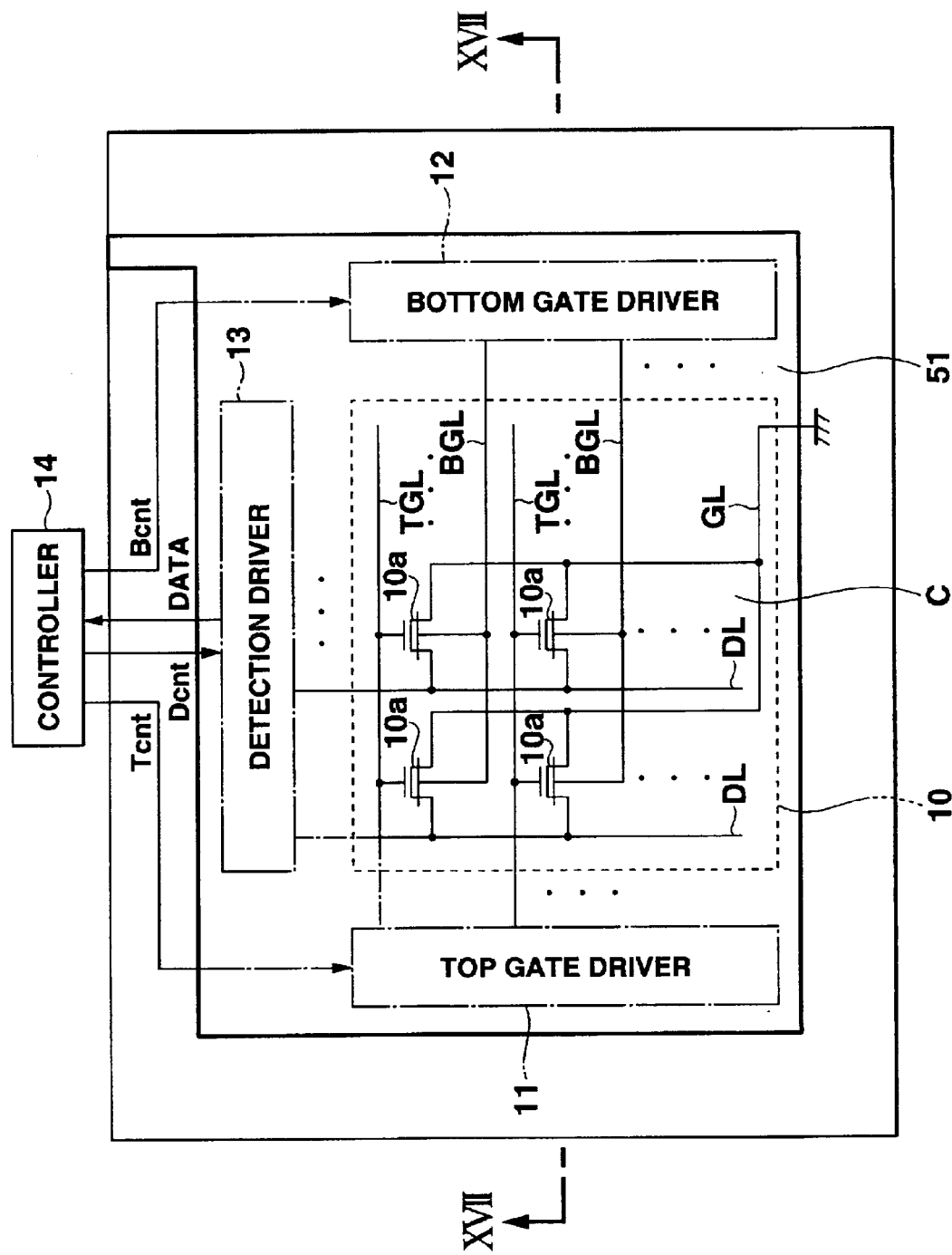
FIG. 16 is a circuit diagram showing a fingerprint reader according to another embodiment of the present invention.
Figure 17:
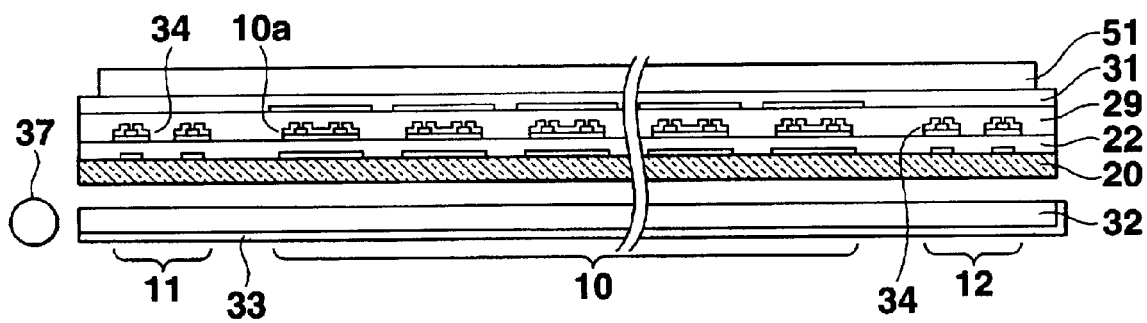
FIG. 17 is a sectional view taken along a line XVII—XVII in FIG. 16.

In the above embodiment, the static electricity protection portion 2 discharges static electricity charged on the finger of the person to be examined. Alternatively, as shown in FIGS. 16 and 17, a transparent conductor (electrode) 51 may be formed above the sensor module 3, and the top gate driver 11, bottom gate driver 12, and detection driver 12 in place of the static electricity protection portion 2. The transparent electrode 51 is formed of ITO, and is connected to the ground.

Upon photosensing using the photosensor array 10, when the finger directly touches the transparent electrode 51, the transparent electrode 51 discharges static electricity to prevent electrostatic discharge damage to the double-gate photosensors 10a. At the same time, the controller 14 detects a voltage or current which deviates slightly in the static electricity protection portion 2 due to addition of the capacitor of the finger, supplies the control signal groups Tcnt, Bcnt, and Dcnt to the top gate driver 11, bottom gate driver 12, and detection driver 13 to start the photosense process, and supplies an emission signal to the backlight 37.

At this time, even when the finger inadvertently covers the top gate driver 11, bottom gate driver 12, and detection driver 13, since the transparent conductor 51 is present between them, static electricity of the finger never acts on the top gate driver 11, bottom gate driver 12, and detection driver 13. Even when an object charged with static electricity other than the finger contacts a portion above the drivers 11 to 13, such electricity can be similarly discharged from the transparent electrode 51.

Figure 18:
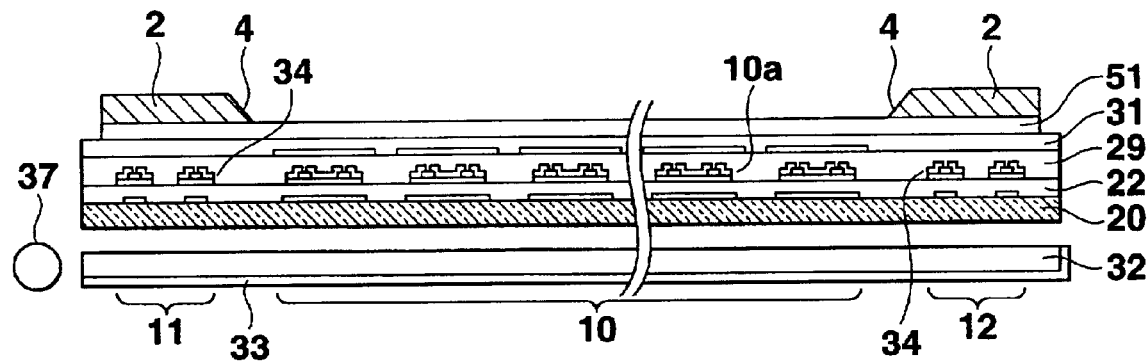
FIG. 18 is a sectional view showing a fingerprint reader according to still another embodiment of the present invention.

In each of the above embodiments, the static electricity protection portion 2 or transparent conductor 51 discharges static electricity built up on an object to be detected, thereby protecting the drivers. Alternatively, as shown in FIG. 18, the transparent conductor 51 formed of ITO or the like may be formed on the protection insulating film 31 of the top gate driver 11, bottom gate driver 12, and detection driver 13, and the static electricity protection portion 2 may be formed on the transparent conductor 51 above the top gate driver 11, bottom gate driver 12, and detection driver 13. Note that the static electricity protection portion 2 may be formed of a semiconductor or insulator in place of a conductor.

Upon photosensing using the photosensor array 10, when the finger directly touches the transparent electrode 51, the transparent electrode 51 and/or the static electricity protection portion 2 discharge or discharges static electricity to prevent electrostatic discharge damage to the double-gate photosensors 10a. At the same time, the controller 14 detects a voltage or current which deviates slightly in the static electricity protection portion 2 due to addition of the capacitor of the finger, supplies the control signal groups Tcnt, Bcnt, and Dcnt to the top gate driver 11, bottom gate driver 12, and detection driver 13 respectively to start the photosense process, and supplies an emission signal to the backlight 37.

Figure 19:
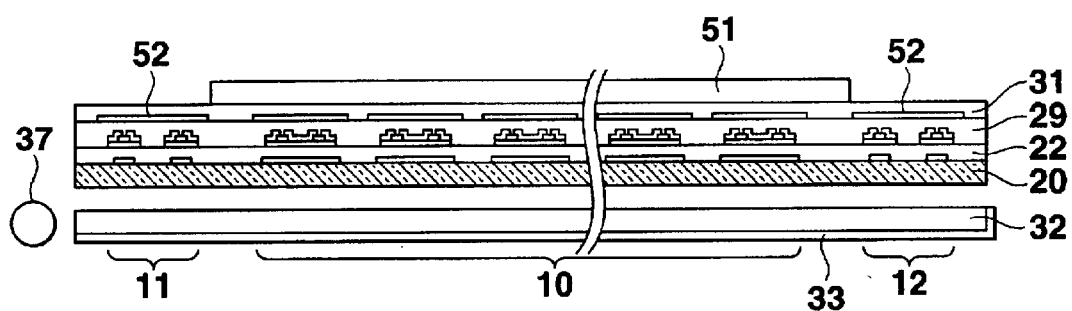
FIG. 19 is a sectional view showing a fingerprint reader according to still another embodiment of the present invention.

Also, as shown in FIG. 19, a transparent conductor 52 formed of ITO or the like may be simultaneously formed in the forming process of the top gate electrode 30 and top gate line TGL. Since the transparent conductor 52 is connected to the ground, even when an object charged with static electricity touches the protection insulating film 31 above the top gate driver 11, bottom gate driver 12, and detection driver 13, such static electricity can be discharged from the transparent conductor 52.

Figure 20:
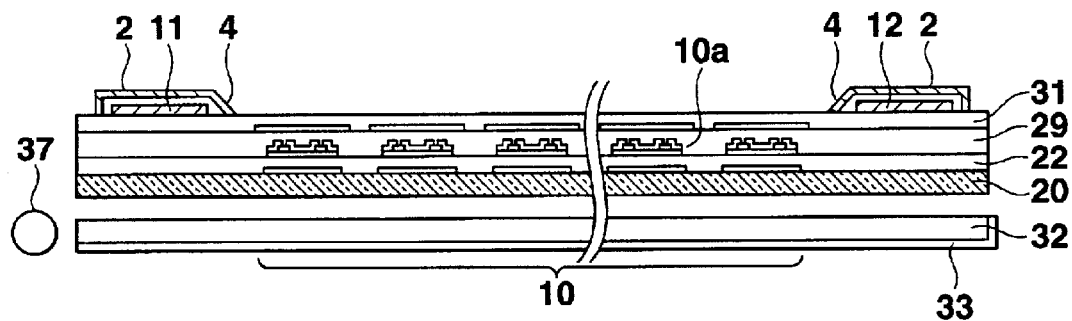
FIG. 20 is a sectional view showing a fingerprint reader according to still another embodiment of the present invention.

In each of the above embodiments, each of the top gate driver 11 and bottom gate driver 12 comprises TFTs which are at least partially formed in the same process as the double-gate photosensors 10a. However, the present invention is not limited to such specific structure. As shown in the structure of FIG. 20, an integrated circuit of monocrystalline silicon may be adopted and formed on the protection insulating film 31, and the static electricity protection portion 2 may cover the top gate driver 11 and bottom gate driver 12 to be spaced apart a predetermined distance from them. That is, the static electricity protection portion 2 may have a structure having spaces that house the top gate driver 11 and bottom gate driver 12 respectively. When the entire static electricity protection portion 2 has conductivity, they are preferably spaced a predetermined distance from the detection driver 13. However, when the object support portion 4 and output terminal have conductivity and are connected to each other, the remaining portion of the static electricity protection portion 2 may be formed of an insulating member. In this case, the insulating member of the static electricity protection portion 2 may be in contact with the top gate driver 11 and bottom gate driver 12. With such structure, an integrated circuit formed of monocrystalline silicon can be adopted as the top gate driver 11 and bottom gate driver 12.

In each of the above embodiments, the static electricity protection portion 2 receives a weak pulse signal Ps from the controller 14 via an output terminal contiguous from the static electricity protection portion 2. Alternatively, the static electricity protection portion 2 may always be fixed to the ground potential in place of receiving the weak pulse signal Ps.

In each of the above embodiments, the reading apparatus using an optical sensor have been explained. However, the present invention is not limited to such specific sensor, but can obtain the same effect even when a sensor that detects a fingerprint pattern based on the difference in capacitance specified by the difference in three-dimensional pattern of the finger is used. In such case, a drive circuit that reads potentials from a plurality of capacitance detection sensors arranged in a matrix can be provided in place of the top gate driver 11, bottom gate driver 12, and detection driver 13.

In each of the above embodiments, the static electricity protection portion 2 and the transparent conductor 51 or 52 are connected to the ground. Alternatively, the reference potential may be set to be the ground potential, a weak waveform signal which periodically fluctuates upward and/ or downward may be applied, and the controller 14 may detect a change in waveform signal due to contact of the finger, and may supply the control signal groups Tcnt, Bcnt, and Dcnt and output an emission signal to the backlight 37 to start the photosense process.

Practical embodiments of the image reading apparatus according to the present invention will be described below. In embodiments to be described below, the aforementioned double-gate photosensors are applied as sensors.

Figure 21:
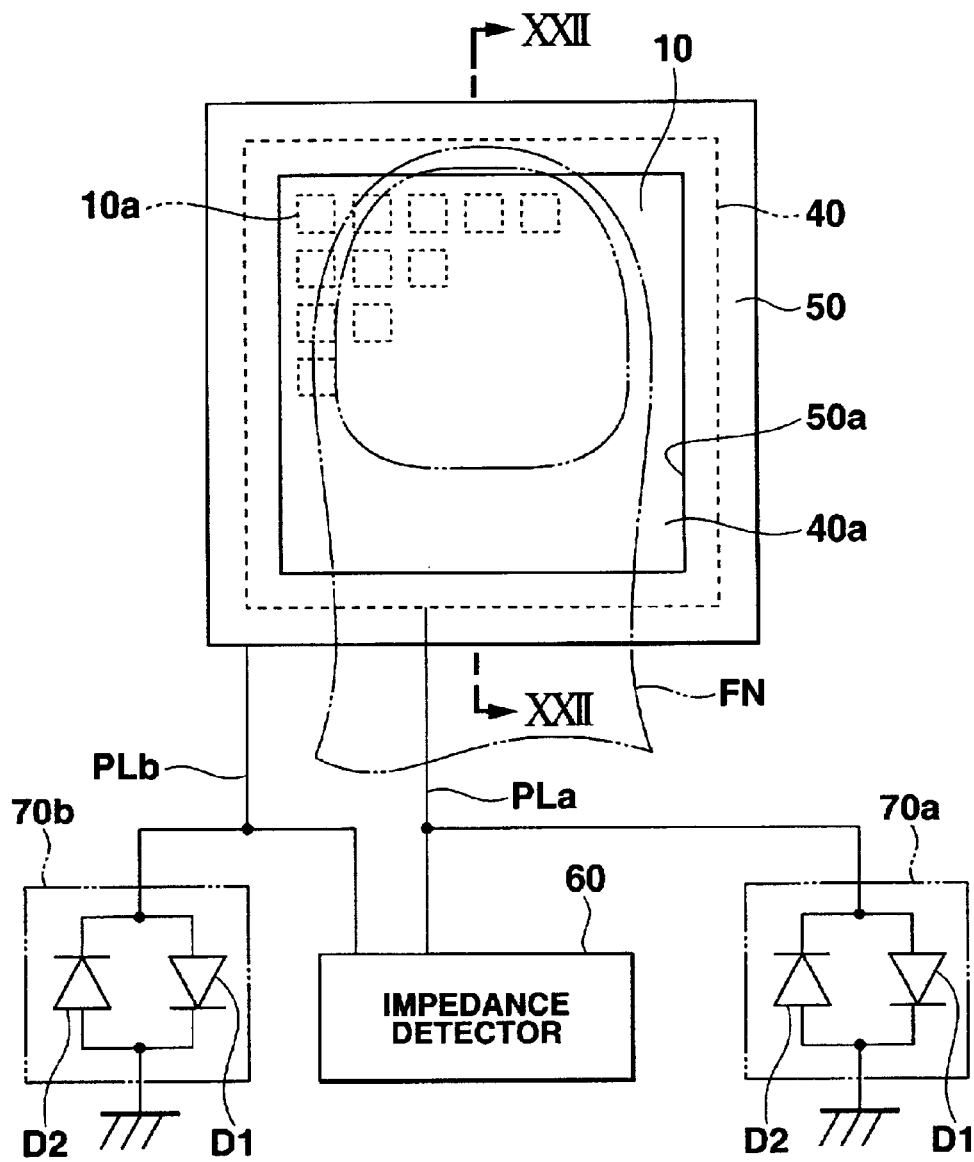
FIG. 21 is a plan view showing a fingerprint reader in which a case member is applied to a static electricity protection portion.
Figure 22:
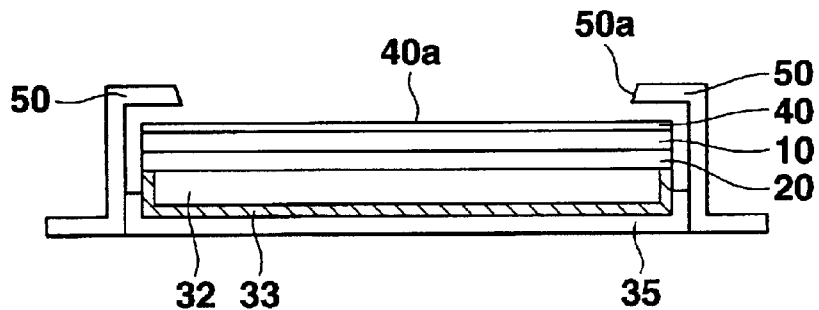
FIG. 22 is a sectional view taken along a line XXII—XXII in FIG. 21.
Figure 23:
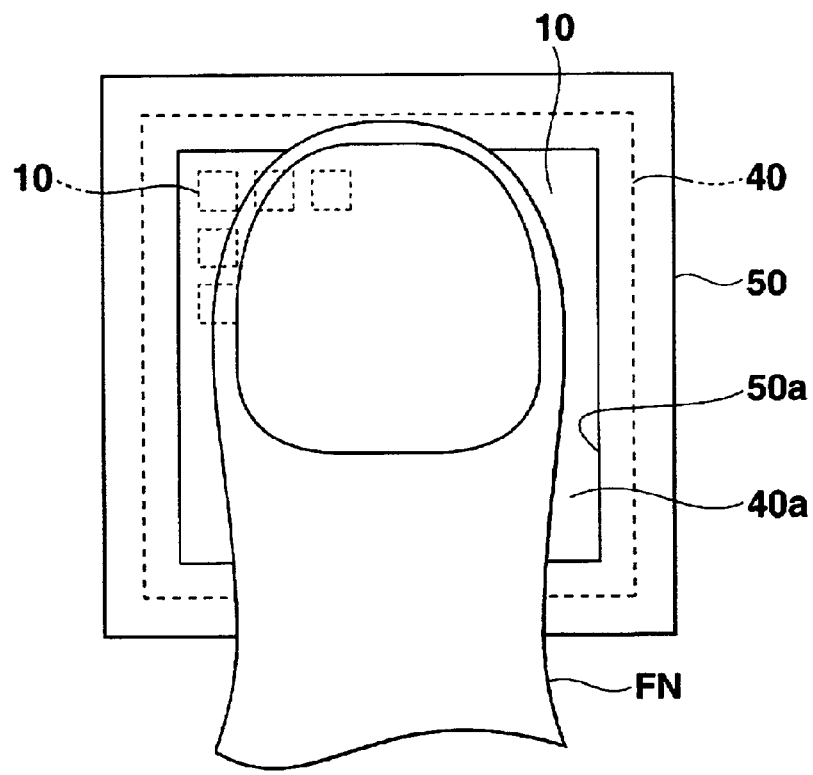
FIG. 23 is a plan view showing the state of the read operation of the fingerprint reader shown in FIG. 21.
Figure 24:
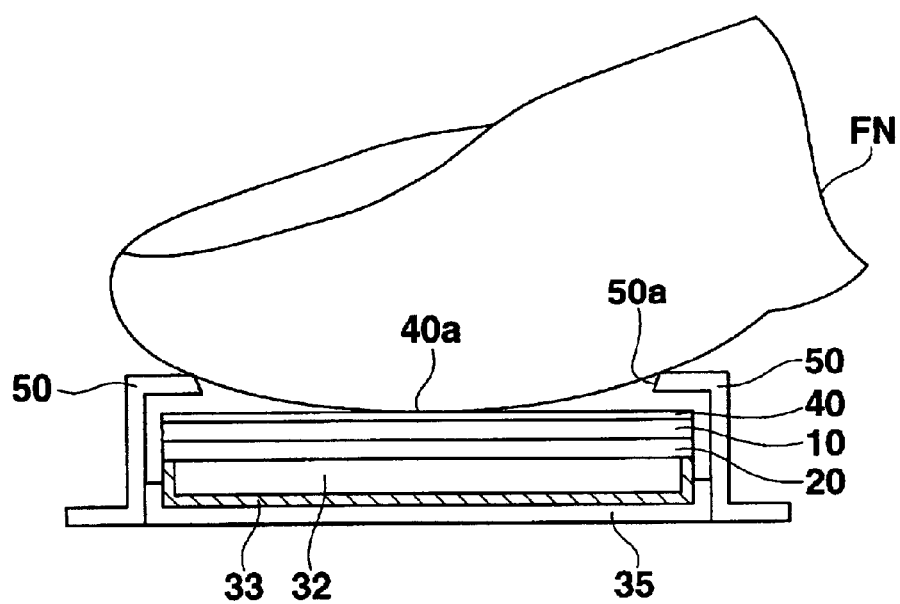
FIG. 24 is a schematic sectional view the reader shown in FIG. 23.

FIGS. 21 and 22 are schematic views showing an embodiment in which the image reading apparatus according to the present invention is applied to a fingerprint reader, and FIGS. 23 and 24 are schematic views showing a state wherein a finger is placed on the fingerprint reader according to this embodiment. Note that the following explanation will refer to the aforementioned arrangements (FIGS. 1 and 12) of the photosensors and photosensor system as needed. The same reference numerals denote the same arrangements as those shown in FIGS. 1 and 12, and a description thereof will be simplified or omitted.

As shown in FIGS. 21 and 22, the insulating substrate 20 is fixed on the upper surface of the light guide plate 32, which is covered by the reflecting member 33 except for the side surface where the backlight 37 (not seen in these figures) is arranged and the upper surface, and the photosensor array 10 formed by arranging a plurality of double-gate photosensors 10a in a matrix is formed on the upper surface of the insulating substrate 20. A transparent electrode layer (first conductive layer) 40 is formed on the photosensor array 10 via the protection insulating film. A smooth object contact surface 40a that allows contact of an object to be detected is formed on the surface of the transparent electrode layer 40.

An insulating support case 35 supports the backlight 37 (not shown in FIG. 22), light guide plate 37, and photosensor array 10 fixed above the light guide plate 32 by holding the lower surface and periphery of the light guide plate 32. A conductive case member 50, which houses the photosensor array 10, backlight 37, light guide plate 32, and transparent electrode layer 40 by covering the periphery of the support case 35, is spaced to be electrically isolated from the transparent electrode layer 40 and photosensor array 10, and surrounds the periphery of the transparent electrode layer 40.

An impedance detector 60 is connected to the transparent electrode layer 40 via a lead wire PLa, and also to the case member 50 via a lead wire PLb, and has a function of detecting a change in input impedance of either the transparent electrode layer 40 or case member 50.

An antiparallel diode circuit 70a is connected to the lead wire PLa, and has a function of discharging electricity when a high voltage such as static electricity or the like is applied to the lead wire PLa, i.e., the transparent electrode layer 40. An antiparallel diode circuit 70b is connected to the lead wire PLb, and has a function of discharging electricity when a high voltage such as static electricity or the like is applied to the lead wire PLb, i.e., the case member 50.

The case member 50 has an opening 50a from which the object contact surface 40a on the transparent electrode layer 40 is exposed. The case member 50 is formed of a material, which is selected from the group consisting of chromium, aluminum, tungsten, and the like, and has a specific resistance lower than a transparent conductive material such as ITO or the like of the transparent electrode layer 40, and comprises one or a plurality of conductor layers having a lower sheet resistance than the transparent electrode layer 40.

More specifically, as shown in FIGS. 23 and 24, the opening 50a of the case member 50 has a shape which makes the finger FN placed on the object contact surface 40a also contact the case member 50 near the edge portion defining the opening 50a. That is, the opening 50a has a shape suitable for making the finger FN contact both the transparent electrode layer 40 and case member 50 at the same time.

Note that the case member 50 may have a function of a shield case for protecting the photosensor array 10 from electrical disturbance factors, physical shock, and the like, or may have a function of a guide member for leading or guiding the finger as an object to be detected to satisfactorily contact the object contact surface 40a on the photosensor array 10, as will be described later.

The impedance detector 60 applies an AC signal voltage having a predetermined signal cycle to one of the transparent electrode layer 40 and case member 50 via the lead wire PLa or PLb, detects a change in input impedance based on the AC signal voltage so as to check if the finger FN is placed on the object contact surface 40a on the photosensor array 10, and outputs a detect signal used to control the start of the fingerprint read operation by the photosensor array 10 to a control circuit (not shown).

Since the case member 50 is formed of a material having a lower specific resistance than the conductor material which forms the transparent electrode layer 40, it can obtain a sufficiently high sheet resistance by a small thickness and, hence, can assure a sufficiently high signal-to-noise (S/N) ratio. Also, since the case member 50 has a nature of reflecting or absorbing visible light and ultraviolet rays, and is arranged to cover the top gate driver 11, bottom gate driver 12, and detection driver 13, it can prevent these drivers 11, 12, and 13 from being exposed to direct external light, and can suppress their deterioration. The control circuit outputs a drive control signal to the respective drivers of the aforementioned photosensor system on the basis of the detect signal, and executes a series of image read operations. Note that the operation of the detector will be described later.

The antiparallel diode circuit 70a has a parallel circuit of a forward diode D1, the anode of which is connected to the transparent electrode layer 40 side, and the cathode of which is connected to the ground potential, and a reverse diode D2, the anode of which is connected to the ground potential and the cathode of which is connected to the transparent electrode layer 40 side. The antiparallel diode circuit 70b has a parallel circuit of a forward diode D1, the anode of which is connected to the case member 50 side, and the cathode of which is grounded, and a reverse diode D2, the anode of which is grounded and the cathode of which is connected to the case member 50 side. That is, the parallel circuits of pairs of diodes D1 and D2, the anodes and cathodes of which are cross-coupled, are inserted between the transparent electrode layer 40 and ground potential, and between the case member and ground potential. The antiparallel diode circuits 70a and 70b are set with discharge threshold values so as to immediately discharge electricity when a voltage much higher than a weak AC signal with a small amplitude (to be described later), i.e., a static electricity voltage as high as several thousand V, is applied to the transparent electrode layer 40 or case member 50, but so as not to be grounded when a voltage as high as the weak AC signal is applied.

The image pattern read operation in the image reading apparatus with the aforementioned arrangement will be described below with reference to the accompanying drawings.

Figure 25:
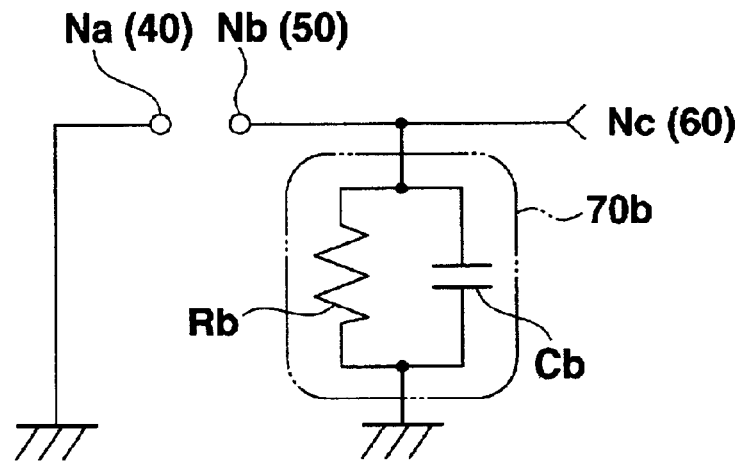
FIG. 25 is an equivalent circuit diagram showing a circuit function in a state wherein an object to be detected does not contact the fingerprint reader according to the embodiment of the present invention.
Figure 26:
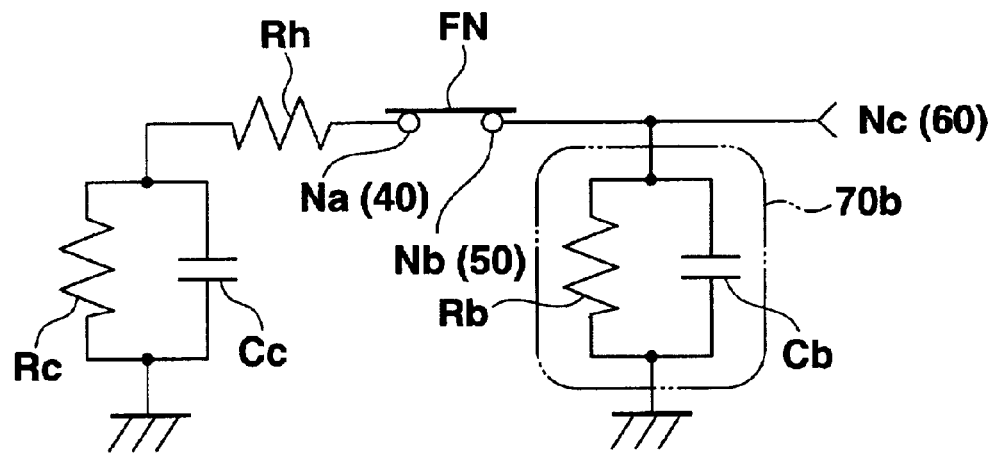
FIG. 26 is an equivalent circuit diagram showing a circuit function in a state wherein an object to be detected contacts the fingerprint reader according to the embodiment of the present invention.
Figure 27:
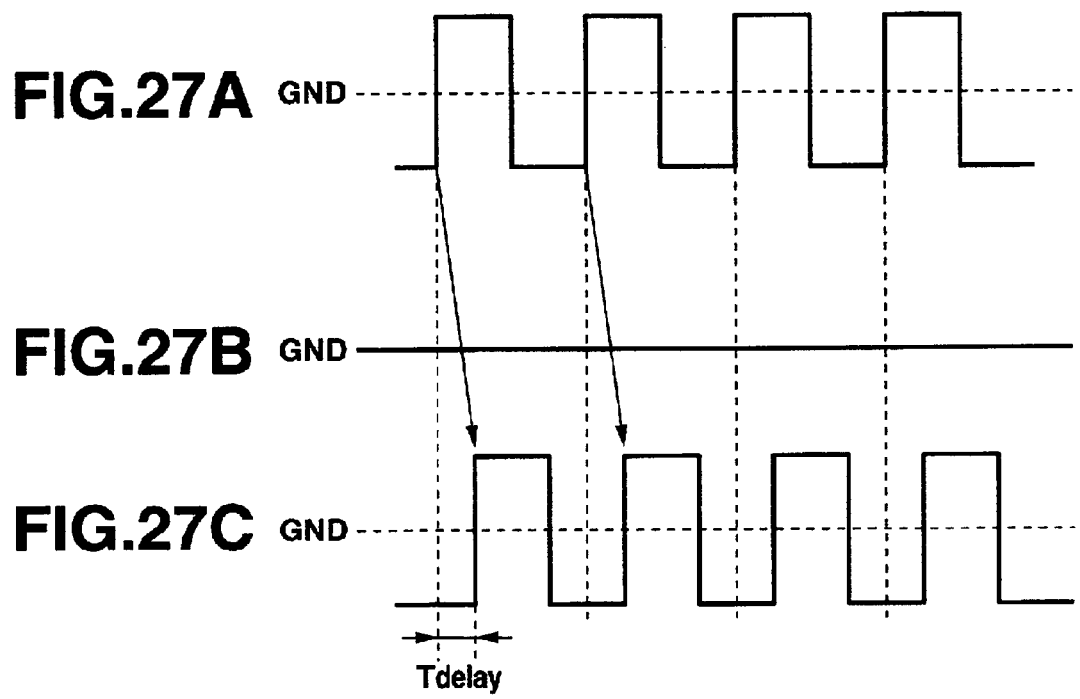
FIGS. 27A to 27C are timing charts showing a change in signal voltage upon detecting the contact state of an object to be detected to the fingerprint reader according to the embodiment of the present invention.

FIGS. 25 and 26 show equivalent circuits indicating circuit functions in a non-contact state and contact state of an object to be detected (finger) with the fingerprint reader according to this embodiment, and FIGS. 27A, 27B, and 27C are timing charts showing changes in signal voltage upon detecting the contact state of the object to be detected (finger) with the fingerprint reader according to this embodiment.

(Non-contact State)

In the aforementioned image reading apparatus, the impedance detector 60 applies, in advance, a weak AC signal (sine wave signal or rectangular wave signal) having a predetermined signal cycle, as shown in, e.g., FIG. 27A, to the case member 50 via the lead wire PLb. In this state, when the object to be detected (finger) is neither placed nor contacts the transparent electrode layer 40 and case member 50, since a contact Na corresponding to the transparent electrode layer 40 and a contact Nb corresponding to the case member 50 are electrically isolated from each other, as shown in FIG. 25, the ground potential is supplied to the contact Na via the antiparallel diode circuit 70a, while a CR circuit as a parallel circuit of a resistance Rb and capacitance Cb is connected to the contact Nb as an equivalent circuit of the antiparallel diode circuit 70b. At this time, a signal voltage on the contact Na side observed by the impedance detector 60 is a constant voltage (ground potential), since the contacts Na and Nb are electrically isolated from each other, and the input impedance (i.e., difficulty in flowing of an AC current based on the AC signal voltage) at the contact Nb when viewed from a contact Nc corresponding to the impedance detector 60 becomes very large.

(Contact State)

On the other hand, as shown in FIGS. 23 and 24, when the finger FN as the object to be detected is placed and contacts to extend across the object contact surface 40a on the upper surface of the transparent electrode layer 40 and the edge portion of the opening 50a of the case member 50, the contacts Na and Nb are electrically short-circuited, and a CR circuit as a parallel circuit of a resistance Rc and capacitance Cc (on the contact Na side), and a contact resistance Rh between the human body and transparent electrode layer 40, are added between the contact Na and ground potential due to the capacitance of the human body, as shown in FIG. 26. At this time, static electricity charged on the finger (human body) FN is immediately discharged via the antiparallel diode circuit 70a or 70b connected to the transparent electrode layer 40 (contact Na) or case member 50 (contact Nb). Also, since the human body (finger) touches both the transparent electrode layer 40 (contact Na) and case member 50 (contact Nb), an AC current flows toward the transparent electrode layer 40 (contact Na) via the human body on the basis of the AC signal voltage applied from the impedance detector 60 to the case member 50 (contact Nb), thus reducing the input impedance at the contact Nb when viewed from the impedance detector 60 (contact Nc). A signal voltage on the contact Na side observed by the impedance detector 60 at that time delays a predetermined time Tdelay from the AC signal (rectangular wave signal) shown in FIG. 27A on the basis of the time constant of the CR circuit added by the human body, and its waveform becomes blunted in correspondence with the resistance unique to the human body, as shown in FIG. 27C.

As a result, in the image reading apparatus according to this embodiment, since the finger FN as the object to be detected contacts both the transparent electrode layer 40 of the photosensor array 10 and the case member 50 arranged around the photosensor array 10, static electricity charged on the finger (human body) FN can be reliably discharged via the CR circuit (antiparallel diode circuit 70b) connected to the contact Nb (static electricity removal function), and the finger FN that is placed and touches the object contact surface 40a on the photosensor array 10 can be accurately detected on the basis of a change in input impedance of the case member (contact Nb) observed by the impedance detector 60 (object detection function), thus implementing startup (trigger) control for stably starting the operation for reading the image pattern of the finger.

In the embodiment described above, the impedance detector 60 applies a predetermined AC signal voltage to the case member 50 via the lead wire PLb, and observes a change in input impedance on the case member 50 side, thereby discriminating the contact state of the finger. However, the present invention is not limited to such specific arrangement. For example, the impedance detector 60 may apply a predetermined AC signal voltage to the transparent electrode layer 40, and may observe a change in input impedance on the transparent electrode layer 40 side.

Figure 28:
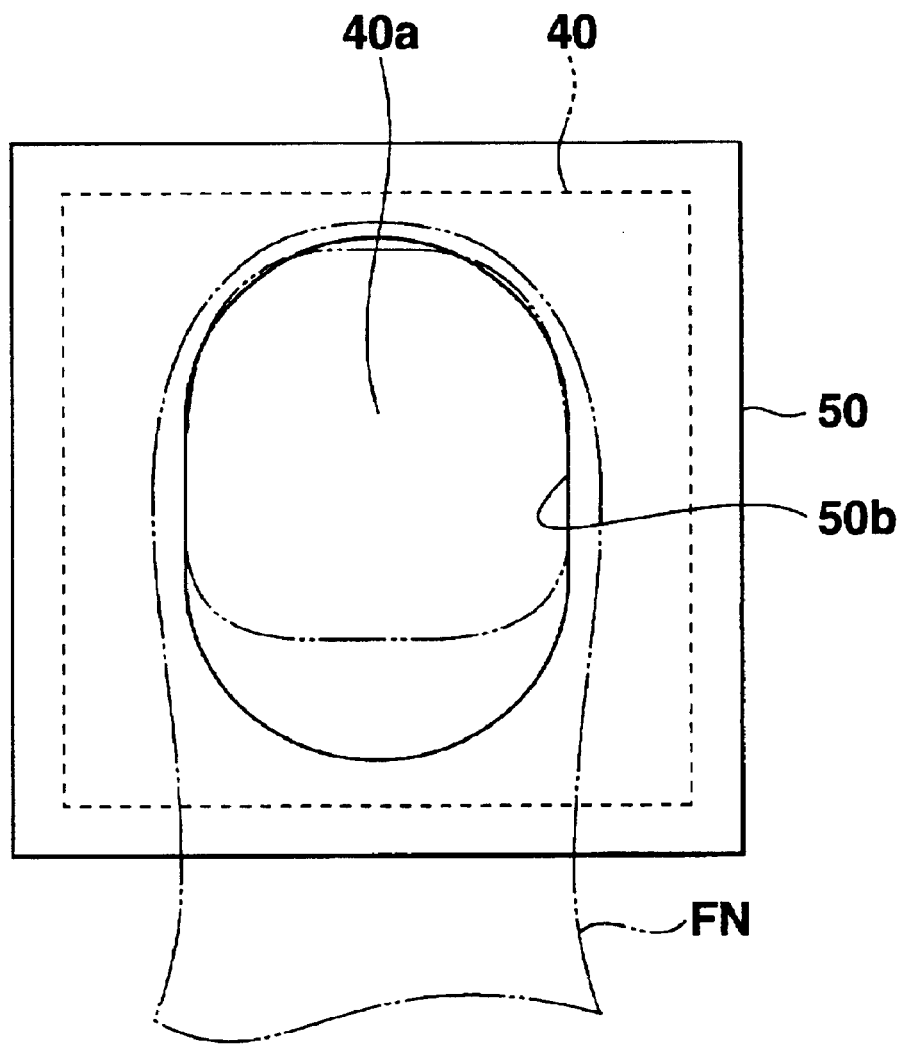
FIG. 28 is a plan view showing a fingerprint reader according to still another embodiment of the present invention.

In the embodiment described above, as the shape of the case member 50, the case member 50 (surrounds the photosensor array 10), and has the rectangular opening 50a from which the transparent electrode layer 40 is exposed, as shown in FIGS. 21, 22, 23, and 24. As described above, in the present invention, since the finger must contact both the transparent electrode layer 40 and case member 50, the case member 50 may have a function of a lead or guide member for making the object to be detected satisfactorily contact the object contact surface 40a. More specifically, as the shape of the case member 50, the case member 50 may have a nearly elliptic or oval opening 50b in correspondence with the shape of the finger FN as the object to be detected so as to make the user of the fingerprint reader visibly recognize the placing position, direction, and the like of the finger FN, and bring the finger FN into satisfactory contact with the object contact surface 40a of the oval opening 50b and also with the edge portion of the case member 50, as shown in, e.g., FIG. 28, thus satisfactorily obtaining the operation and effect of this embodiment.

Figure 29:
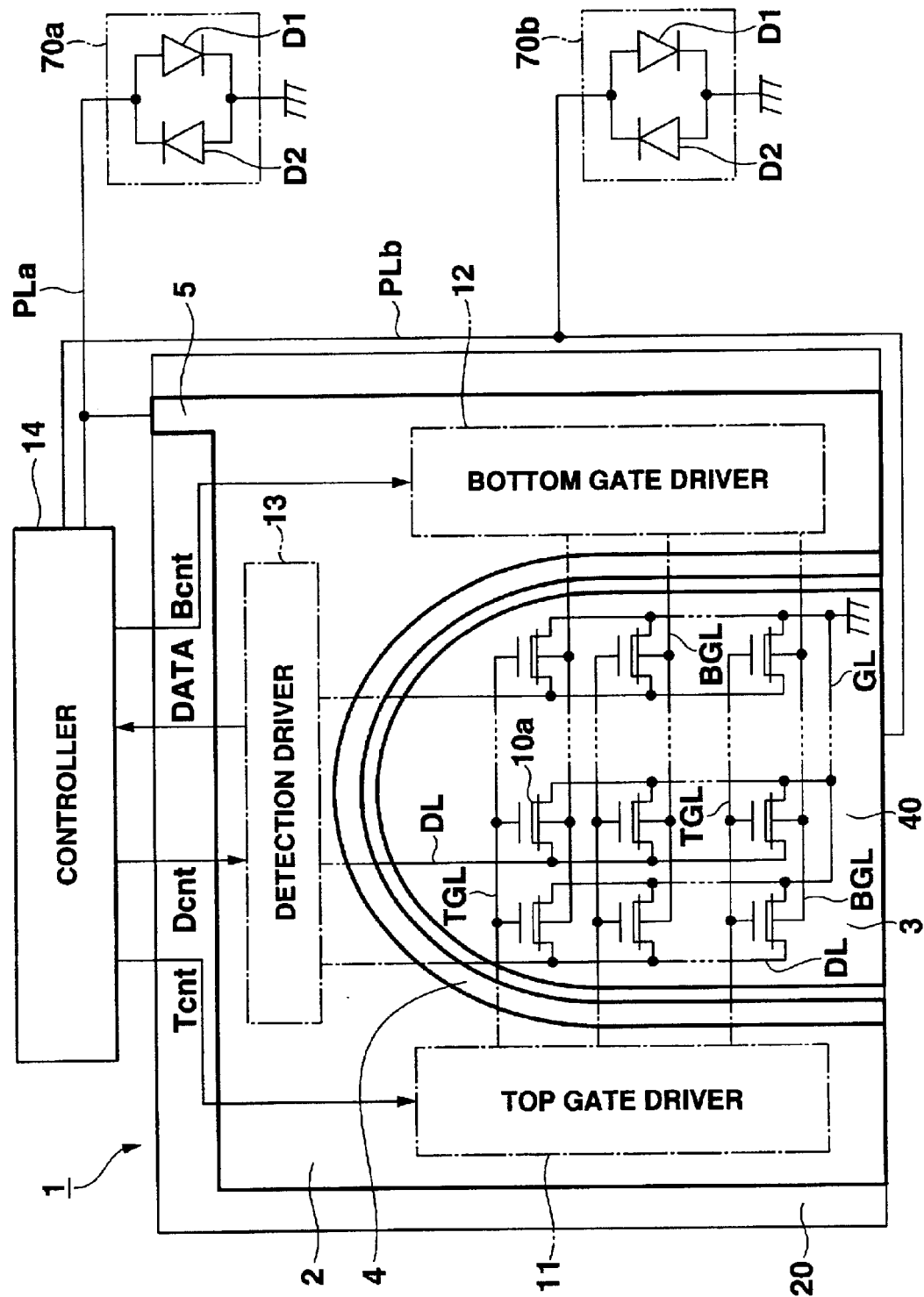
FIG. 29 is a plan view showing a fingerprint reader according to still another embodiment of the present invention.
Figure 30:
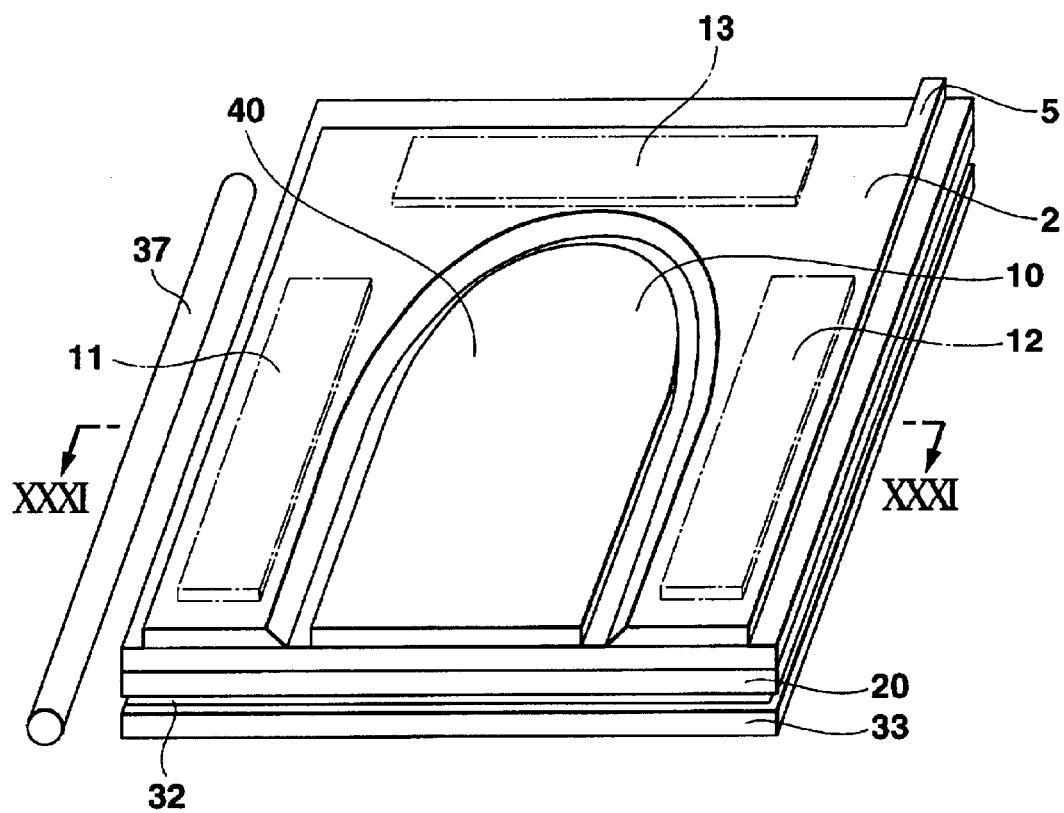
FIG. 30 is a perspective view of a sensor module in FIG. 29.
Figure 31:
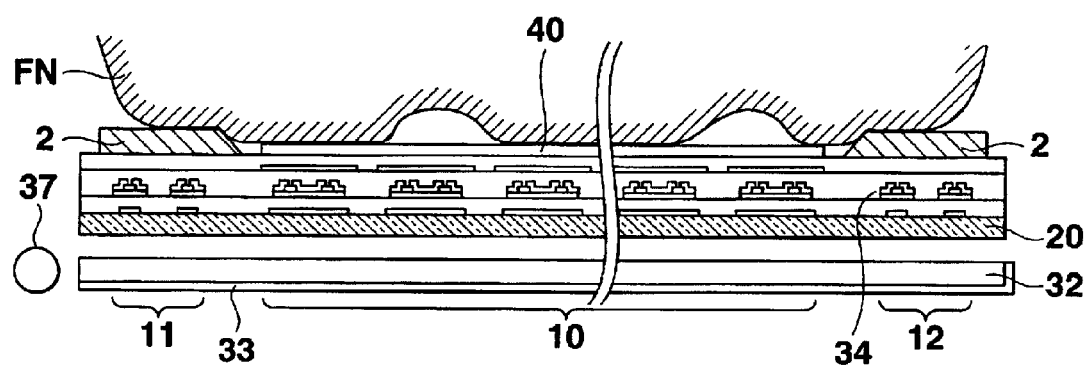
FIG. 31 is a sectional view taken along a line XXXI—XXXI in FIG. 30.

Also, as shown in FIG. 29, the antiparallel diode circuits may be applied to the image reading apparatus 1 with the light-shielding static electricity protection portion 2. In this case, the antiparallel diode circuit 70a is connected to the static electricity protection portion 2, and the antiparallel diode circuit 70b is connected to the fingertip-plane-like transparent electrode layer 40 formed on the object contact surface. The controller 14, which also serves as the impedance detector 60, outputs an AC signal to one of the static electricity protection portion 2 and transparent electrode 40, and detects a change in waveform when the object to be detected contacts both of them. As shown in FIGS. 30 and 31, the static electricity protection portion 2 has a function of electrically shielding between the object to be detected charged with static electricity and the drivers 11 to 13, and a function of guiding the finger to a predetermined position, since it sufficiently covers the drivers 11 to 13. Also, the static electricity protection portion 2 is applied with an AC signal enough to detect if the object to be detected is a finger.

Furthermore, in the embodiment described above, the double-gate photosensors are used as sensors. However, sensors applied to the present invention are not limited to such double-gate photosensors, and the present invention can be similarly applied to a photosensor system which uses other types of photosensors such as photodiodes, TFTs, and the like. In the above embodiments, optical, i.e., so-called photosensors are used. However, for example, capacitive sensors which read changes in capacitance in correspondence with the three-dimensional pattern of the finger, and are set with a threshold value, may be used. That is, the image reading apparatus according to the present invention can be applied to any sensor systems as long as they have an arrangement and method for detecting signal components (voltages, deviation voltages, and the like) output from a plurality of sensors, and discriminating a feature portion contained in an image pattern of an object to be detected on the basis of the tendency of changes in frequency with respect to the signal components obtained by observing the numbers (frequencies) of sensors for respective signal components. Also, the drivers 11 and 12 need not comprise TFTs, but may comprise integrated circuits formed of monocrystalline silicon chips.

In each of the above embodiments, the backlight 37 is used. However, the present invention is not limited to this. For example, light which is transmitted through the object to be detected may be read using external light around the reading apparatus, a structure that irradiates the object to be detected with front light from the above may be used, or both the backlight and front light may be used.

In each of the above embodiments in which it is checked if the finger is placed on the reading apparatus, the transparent electrode layer 40 is arranged above the photosensor array 10, and the static electricity protection portion 2 is arranged above the drivers 11 to 13 to read a change in waveform when the finger is placed on the transparent electrode layer 40 and static electricity protection portion 2. However, the present invention is not limited to such specific structure. For example, the transparent electrode layer 40 may also be formed above at least one of the drivers 11 to 13 in addition to the photosensor array 10 so as to serve as the static electricity protection portion 2. In this case, an electrode which is separated from the transparent electrode layer 40 and is formed at a position where the finger touches it simultaneously with the transparent electrode layer 40 is preferably added, so as to check if a finger is placed.

The reading apparatus used in each of the above embodiment can be applied to a personal authentication device which is attached to an information terminal such as a portable phone or the like, or a personal computer to limit accesses of unregistered persons, or which is arranged at a door or entrance to prevent unregistered persons from entering.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their various defined by the appended claims and their equivalents.

What is claimed is:

1. A reading apparatus comprising:
   a substrate having a face side;
   a sensor unit arranged on the face side of said substrate to read an object to be detected;
   a driver circuit unit arranged on the face side of said substrate to supply a drive signal for driving said sensor unit, said driver circuit having an upper surface; and
   a static electricity protection portion covering at least a portion of the upper surface of said driver circuit unit, wherein at least a portion of said static electricity protection portion has electrical conductivity.

2. The apparatus according to claim 1, wherein said static electricity protection portion comprises an opaque conductive film.

3. The apparatus according to claim 1, wherein said static electricity protection portion is shaped to hold the object to be detected.

4. The apparatus according to claim 1, wherein said sensor unit comprises a plurality of photosensors.

5. The apparatus according to claim 4, wherein said plurality of photosensors are double-gate photosensors, and said driver circuit unit comprises a top gate driver and bottom gate driver for driving said double-gate photosensors.

6. The apparatus according to claim 5, wherein said top gate driver and said bottom gate driver are fabricated in a same process as at least a partial process for fabricating said double-gate photosensors.

7. The apparatus according to claim 1, wherein at least a portion of said sensor unit and a portion of said driver circuit unit are covered by an insulating film, and said static electricity protection portion is formed on said insulating film.

8. The apparatus according to claim 1, wherein said static electricity protection portion comprises a gap for housing said driver circuit unit.

9. The apparatus according to claim 1, wherein said static electricity protection portion is adapted to receive a weak pulse signal for detecting when the object to be detected touches said static electricity protection portion.

10. The apparatus according to claim 1, wherein said static electricity protection portion is adapted to discharge static electricity when the object to be detected is charged with static electricity and contacts or approaches said static electricity protection portion.

11. The apparatus according to claim 1, wherein said driver circuit unit comprises an integrated circuit formed of monocrystalline silicon.

12. The apparatus according to claim 1, wherein said static electricity protection portion comprises a transparent conductive film.

13. A reading apparatus comprising:
   a substrate having a face side;
   a member which is formed on the face side of said substrate, and which has a contact surface;
   a photosensor array which is positioned between the substrate and the member, and which includes a plurality of double-gate photosensors arranged in a matrix on the face side of said substrate for optically reading a finger when the finger is placed on the contact surface of the member;
   a top gate driver, bottom gate driver, and detection driver which are provided on the face side of said substrate, and which supply drive signals for driving said plurality of double-gate photosensors; and
   a static electricity protection portion which covers said top gate driver, bottom gate driver, and detection driver, and which holds the finger when the finger is placed on the contact surface, and which discharges static electricity charged on the finger.

14. The apparatus according to claim 13, wherein said substrate further comprises an opposite face side, and a light source provided on the opposite face side for emitting light toward the finger placed on the contact surface via said plurality of double-gate photosensors.

15. The apparatus according to claim 13, wherein said apparatus is adapted to be connected to a computer.

* * * * *